(12) United States Patent
Shirakawa et al.

(10) Patent No.: US 12,615,028 B2
(45) Date of Patent: Apr. 28, 2026

(54) BULK ACOUSTIC WAVE COMPONENT WITH CIRCUIT ELEMENT INCLUDING CONDUCTIVE MATERIAL BURIED IN DIELECTRIC

(71) Applicant: Skyworks Global Pte. Ltd., Singapore (SG)

(72) Inventors: Alexandre Augusto Shirakawa, Cardiff by the Sea, CA (US); Kwang Jae Shin, Yongin (KR); Jae Hyung Lee, Seoul (KR); Taecheol Shon, Hwaseong-si (KR); David Albert Feld, Los Altos, CA (US); Zongliang Cao, Irvine, CA (US); Stephen Joseph Kovacic, Sarasota, FL (US)

(73) Assignee: Skyworks Global Pte. Ltd., Singapore (SG)

( * ) Notice: Subject to any disclaimer, the term of this patent is extended or adjusted under 35 U.S.C. 154(b) by 0 days.

(21) Appl. No.: 18/639,827

(22) Filed: Apr. 18, 2024

(65) Prior Publication Data

US 2024/0356530 A1 Oct. 24, 2024

Related U.S. Application Data

(60) Provisional application No. 63/497,130, filed on Apr. 19, 2023, provisional application No. 63/497,041, (Continued)

(51) Int. Cl.
*H03H 9/02* (2006.01)
*H03H 9/13* (2006.01)
(Continued)

(52) U.S. Cl.
CPC ...... *H03H 9/02007* (2013.01); *H03H 9/0211* (2013.01); *H03H 9/133* (2013.01); (Continued)

(58) Field of Classification Search
CPC .... H03H 9/02; H03H 9/02007; H03H 9/0211; H03H 9/17; H03H 9/173; H03H 9/13; (Continued)

(56) References Cited

U.S. PATENT DOCUMENTS

| | | | |
|---|---|---|---|
| 6,713,314 B2 | 3/2004 | Wong et al. | |
| 7,161,283 B1 | 1/2007 | Geefay | |
(Continued)

OTHER PUBLICATIONS

Smith et al., "Multiple Notch Filter Using On-Die BAW MIM Cap", Technical Disclosure Commons, Qorvo US, Inc., available from: https://www.tdcommons.org/dpubs_series/5565 (accessed: Jul. 16, 2024), Dec. 12, 2022.
(Continued)

*Primary Examiner* — Hai L Nguyen
(74) *Attorney, Agent, or Firm* — Knobbe, Martens, Olson & Bear, LLP

(57) ABSTRACT

Aspects of this disclosure relate to a bulk acoustic wave component that includes a bulk acoustic wave resonator, a capacitor, and a circuit element electrically connected to the bulk acoustic wave resonator. The capacitor includes an electrode buried in dielectric material. The circuit element includes conductive material in the dielectric layer. Related filters, multiplexers, radio frequency modules, radio frequency systems, wireless communication devices, and methods are disclosed.

20 Claims, 25 Drawing Sheets

Related U.S. Application Data filed on Apr. 19, 2023, provisional application No. 63/497,034, filed on Apr. 19, 2023.

(51) Int. Cl.

| | |
|---|---|
| *H03H 9/17* | (2006.01) |
| *H03H 9/54* | (2006.01) |
| *H03H 9/56* | (2006.01) |
| *H03H 9/58* | (2006.01) |
| *H04B 1/38* | (2015.01) |

(52) U.S. Cl.

CPC .............. *H03H 9/17* (2013.01); *H03H 9/173* (2013.01); *H03H 9/175* (2013.01); *H03H 9/54* (2013.01); *H03H 9/542* (2013.01); *H03H 9/568* (2013.01); *H03H 9/58* (2013.01); *H04B 1/38* (2013.01)

(58) Field of Classification Search

CPC .......... H03H 9/175; H03H 9/54; H03H 9/542; H03H 9/547; H03H 9/568; H03H 9/60; H03H 9/70; H03H 9/205

USPC ................................................. 327/551–559

See application file for complete search history.

(56) References Cited

U.S. PATENT DOCUMENTS

| | | | |
|---|---|---|---|
| 7,250,831 | B2 | 7/2007 | Song et al. |
| 7,615,833 | B2 | 11/2009 | Larson, III et al. |
| 7,863,699 | B2 | 1/2011 | Dropmann et al. |
| 8,749,320 | B2 | 6/2014 | Nishihara et al. |
| 8,922,302 | B2 | 12/2014 | Ruby |
| 9,214,920 | B2 | 12/2015 | Link et al. |
| 9,444,426 | B2 | 9/2016 | Burak et al. |
| 9,450,167 | B2 | 9/2016 | Zou et al. |
| 9,793,877 | B2 | 10/2017 | Martin et al. |
| 10,439,580 | B2 | 10/2019 | Hurwitz |
| 10,873,311 | B2 | 12/2020 | Ando et al. |
| 10,886,888 | B2 | 1/2021 | Ivira et al. |
| 11,082,023 | B2 | 8/2021 | Shin et al. |
| 11,146,236 | B2 | 10/2021 | Jhung et al. |
| 11,159,142 | B2 | 10/2021 | Matsuo |
| 11,316,494 | B2 | 4/2022 | Liu et al. |
| 11,349,454 | B2 | 5/2022 | Shin et al. |
| 11,387,808 | B2 | 7/2022 | Shin et al. |
| 11,405,013 | B2 | 8/2022 | Shin et al. |
| 11,424,732 | B2 | 8/2022 | Shin et al. |
| 11,431,315 | B2 | 8/2022 | Matsuo |
| 11,522,513 | B2 | 12/2022 | Shin et al. |
| 11,581,869 | B2 | 2/2023 | Shin et al. |
| 11,595,018 | B2 | 2/2023 | Liu et al. |
| 11,601,113 | B2 | 3/2023 | Wang et al. |
| 11,671,074 | B2 | 6/2023 | Matsuo et al. |
| 11,677,374 | B2 | 6/2023 | Liu et al. |
| 11,916,535 | B2 | 2/2024 | Jhung et al. |
| 11,967,939 | B2 | 4/2024 | Shin et al. |
| 11,979,140 | B2 | 5/2024 | Matsuo et al. |
| 12,021,506 | B2 | 6/2024 | Shin et al. |
| 12,028,041 | B2 | 7/2024 | Liu et al. |
| 12,068,736 | B2 | 8/2024 | Liu et al. |
| 12,088,278 | B2 | 9/2024 | Shin et al. |
| 12,101,077 | B2 | 9/2024 | Zhang et al. |
| 12,184,260 | B2 | 12/2024 | Shin et al. |
| 12,334,903 | B2 * | 6/2025 | Kim .................... H03H 9/725 |
| 2005/0140468 | A1 | 6/2005 | Wang |
| 2006/0012021 | A1 | 1/2006 | Larson, et al. |
| 2006/0249824 | A1 | 11/2006 | Lee et al. |
| 2006/0267710 | A1 | 11/2006 | Matsumoto et al. |
| 2007/0080757 | A1 | 4/2007 | Yahata et al. |
| 2007/0085632 | A1 | 4/2007 | Larson et al. |
| 2007/0115078 | A1 | 5/2007 | Sano et al. |
| 2008/0169884 | A1 | 7/2008 | Matsumoto et al. |
| 2009/0116875 | A1 | 5/2009 | Sugiyama et al. |

| | | | |
|---|---|---|---|
| 2009/0134957 | A1 | 5/2009 | Shin |
| 2010/0085134 | A1 | 4/2010 | Lee et al. |
| 2011/0156836 | A1 | 6/2011 | Lee et al. |
| 2013/0313947 | A1 | 11/2013 | Chen et al. |
| 2014/0252549 | A1 | 9/2014 | Pan et al. |
| 2016/0315244 | A1 | 10/2016 | Khurshidjon et al. |
| 2016/0365843 | A1 | 12/2016 | Martin et al. |
| 2018/0068915 | A1 | 3/2018 | Kang et al. |
| 2019/0149123 | A1 | 5/2019 | Sakashita |
| 2019/0379349 | A1 | 12/2019 | Lee et al. |
| 2020/0021265 | A1 | 1/2020 | Lee et al. |
| 2020/0083861 | A1 | 3/2020 | Matsuo et al. |
| 2020/0099365 | A1 | 3/2020 | Choy et al. |
| 2020/0235716 | A1 | 7/2020 | Eid et al. |
| 2020/0287520 | A1 | 9/2020 | Kamgaing et al. |
| 2020/0321940 | A1 | 10/2020 | Cheon et al. |
| 2020/0373899 | A1 | 11/2020 | Lee et al. |
| 2021/0099157 | A1 | 4/2021 | Takano et al. |
| 2022/0094323 | A1 | 3/2022 | Zhang et al. |
| 2022/0094324 | A1 | 3/2022 | Zhang et al. |
| 2022/0103159 | A1 | 3/2022 | Shin et al. |
| 2022/0311410 | A1 | 9/2022 | Komatsu et al. |
| 2022/0311411 | A1 | 9/2022 | Liu et al. |
| 2022/0311412 | A1 | 9/2022 | Liu et al. |
| 2022/0321080 | A1 | 10/2022 | Shirakawa et al. |
| 2022/0321095 | A1 | 10/2022 | Liu et al. |
| 2022/0321100 | A1 | 10/2022 | Liu et al. |
| 2022/0321101 | A1 | 10/2022 | Liu et al. |
| 2022/0321102 | A1 | 10/2022 | Shirakawa et al. |
| 2022/0337213 | A1 | 10/2022 | Habana et al. |
| 2022/0337217 | A1 | 10/2022 | Habana et al. |
| 2022/0368311 | A1 | 11/2022 | Shin et al. |
| 2022/0368312 | A1 | 11/2022 | Wang et al. |
| 2022/0393664 | A1 | 12/2022 | Liu et al. |
| 2023/0006642 | A1 | 1/2023 | Liu et al. |
| 2023/0098376 | A1 | 3/2023 | Shin et al. |
| 2023/0098495 | A1 | 3/2023 | Shin et al. |
| 2023/0103898 | A1 | 4/2023 | Abbott et al. |
| 2023/0105560 | A1 | 4/2023 | Shin et al. |
| 2023/0106034 | A1 | 4/2023 | Shin et al. |
| 2023/0106431 | A1 | 4/2023 | Abbott et al. |
| 2023/0108824 | A1 | 4/2023 | Bader et al. |
| 2023/0109080 | A1 | 4/2023 | Bader et al. |
| 2023/0109382 | A1 | 4/2023 | Liu et al. |
| 2023/0109569 | A1 | 4/2023 | Bader et al. |
| 2023/0109580 | A1 | 4/2023 | Abbott et al. |
| 2023/0113584 | A1 | 4/2023 | Cheng et al. |
| 2023/0136934 | A1 | 5/2023 | Shin et al. |
| 2023/0216462 | A1 | 7/2023 | Shi et al. |
| 2023/0216478 | A1 | 7/2023 | Caron et al. |
| 2023/0253942 | A1 | 8/2023 | Matsuda et al. |
| 2023/0327635 | A1 | 10/2023 | Hill et al. |
| 2023/0353119 | A1 | 11/2023 | Hill et al. |
| 2024/0112904 | A1 | 4/2024 | Cheng et al. |
| 2024/0235518 | A1 | 7/2024 | Wloczysiak et al. |
| 2024/0243722 | A1 | 7/2024 | Shin et al. |
| 2024/0283427 | A1 | 8/2024 | Jhung et al. |
| 2024/0297635 | A1 | 9/2024 | Shin et al. |
| 2024/0305263 | A1 | 9/2024 | Shin et al. |
| 2024/0356514 | A1 | 10/2024 | Shirakawa et al. |
| 2024/0356529 | A1 | 10/2024 | Shirakawa et al. |
| 2024/0356531 | A1 | 10/2024 | Shirakawa et al. |
| 2024/0421793 | A1 | 12/2024 | Liu et al. |
| 2024/0431212 | A1 | 12/2024 | Abbott et al. |
| 2025/0007485 | A1 | 1/2025 | Liu et al. |
| 2025/0007494 | A1 | 1/2025 | Liu et al. |
| 2025/0023552 | A1 | 1/2025 | Shin et al. |
| 2025/0062745 | A1 | 2/2025 | Shirakawa et al. |
| 2025/0192751 | A1 * | 6/2025 | Shin ...................... H03H 9/173 |

OTHER PUBLICATIONS

U.S. Appl. No. 18/639,837 Published As filed Apr. 18, 2024, Bulk Acoustic Wave Device Structure With Circuit Element Including Buried Conductor.

U.S. Appl. No. 18/639,804 Published As filed Apr. 18, 2024, Bulk Acoustic Wave Device Structure With Metal-Insulator Metal Capacitor.

(56) References Cited

OTHER PUBLICATIONS

U.S. Appl. No. 18/639,846 Published As filed Apr. 18, 2024, Filter With Bulk Acoustic Wave Resonator In Parrallel With Capacitor.

\* cited by examiner

CAPACITORS STEEPEN
FILTER SKIRT

FREQ, GHz

A                                                                                        A′

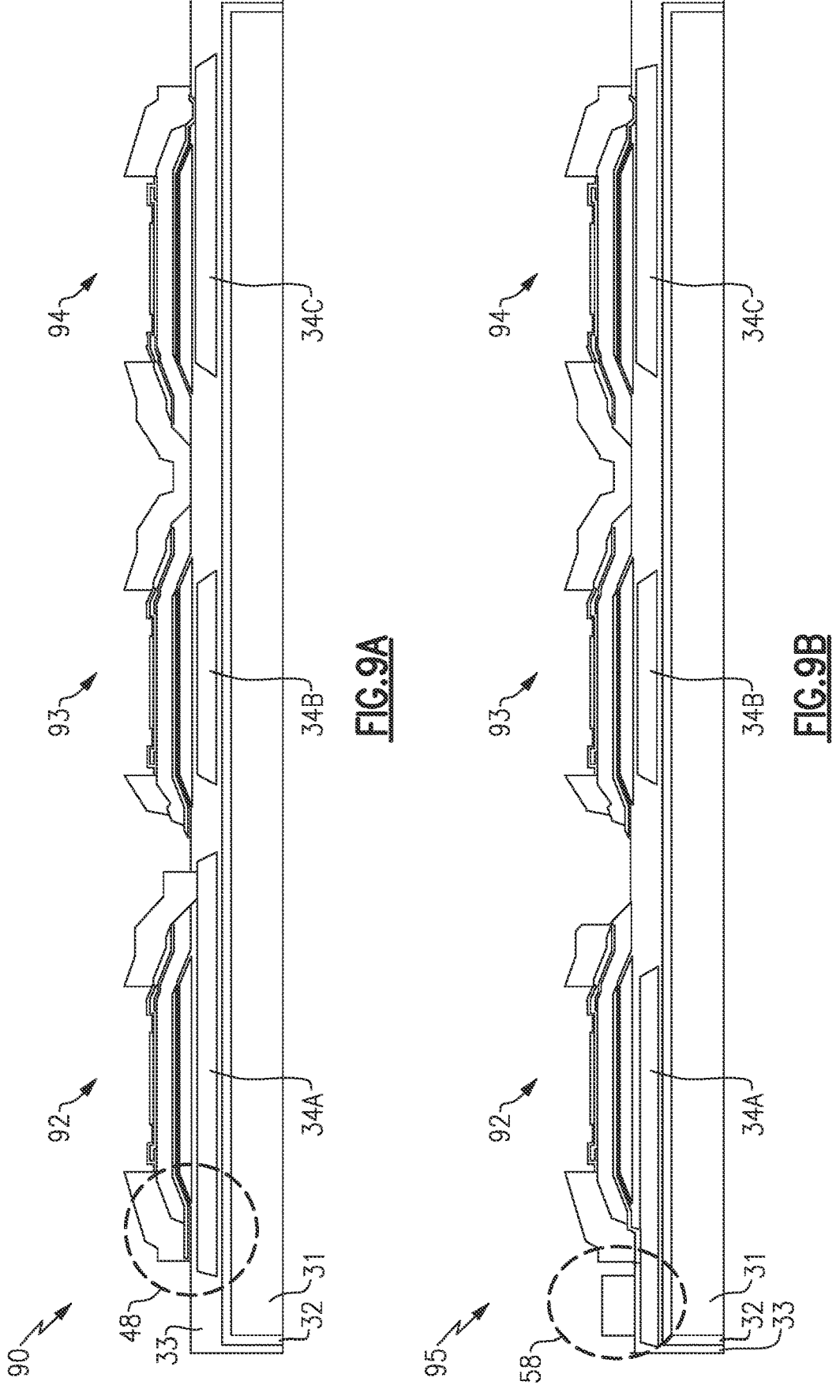

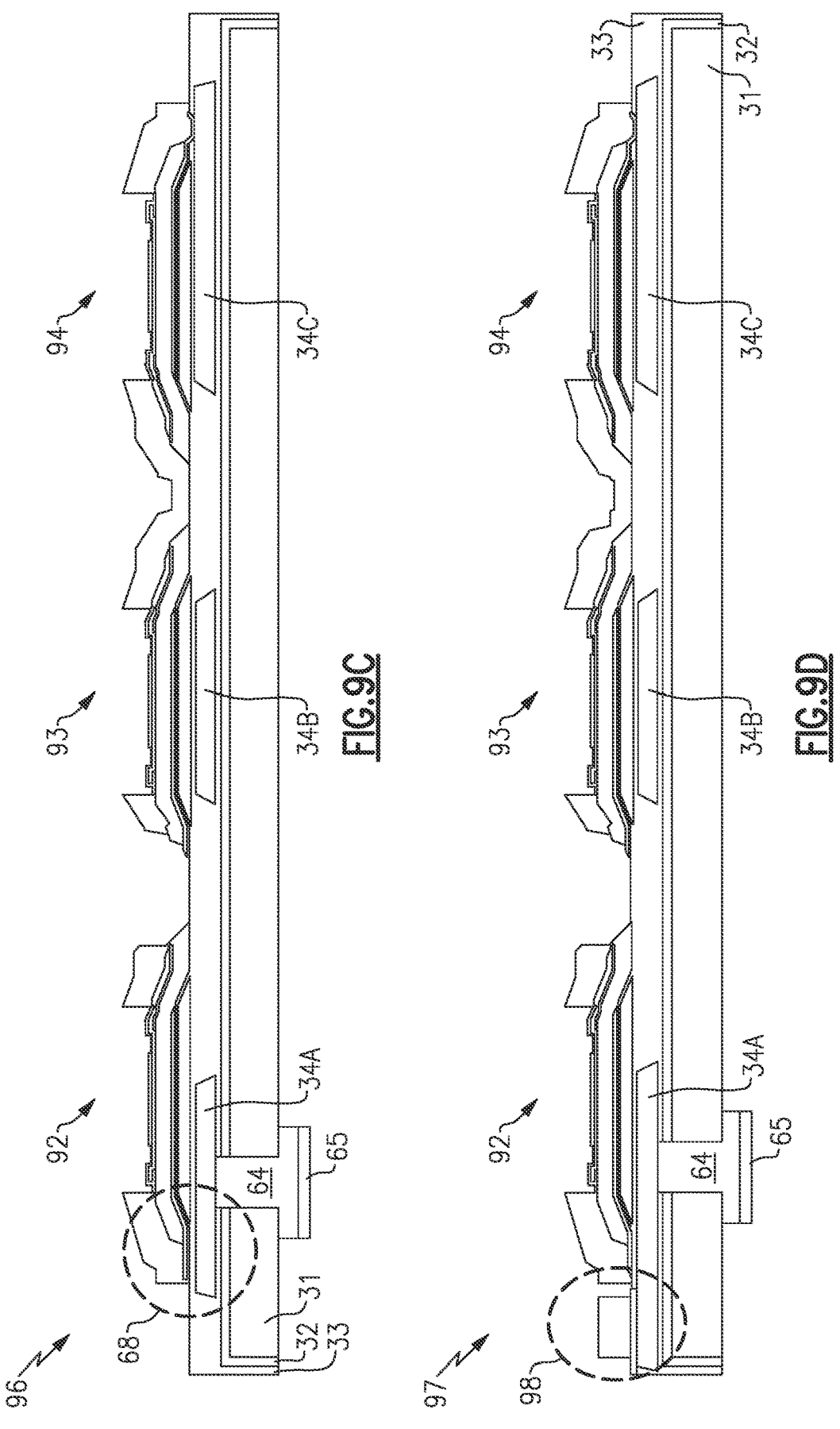

160

RF_IN        RF_OUT

1

BULK ACOUSTIC WAVE COMPONENT WITH CIRCUIT ELEMENT INCLUDING CONDUCTIVE MATERIAL BURIED IN DIELECTRIC

CROSS REFERENCE TO PRIORITY APPLICATIONS

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/497,041, filed Apr. 19, 2023 and titled "BULK ACOUS-TIC WAVE DEVICE STRUCTURE WITH CIRCUIT ELE-MENT INCLUDING BURIED CONDUCTOR," and claims the benefit of priority of U.S. Provisional Application No. 63/497,034, filed Apr. 19, 2023 and titled "BULK ACOUSTIC WAVE DEVICE STRUCTURE WITH METAL-INSULATOR-METAL CAPACITOR," and claims the benefit of priority of U.S. Provisional Application No. 63/497,130, filed Apr. 19, 2023 and titled "FILTER WITH BULK ACOUSTIC WAVE RESONATOR IN PARALLEL WITH CAPACITOR," the disclosures of each of which are hereby incorporated by reference in their entireties and for all purposes.

BACKGROUND

Technical Field

The disclosed technology relates to bulk acoustic wave resonators and a conductive layer buried in a dielectric layer.

Description of Related Technology

Acoustic wave filters can be implemented in radio frequency electronic systems. For instance, filters in a radio frequency front end of a mobile phone can include one or more acoustic wave filters. A plurality of acoustic wave filters can be arranged as a multiplexer. For instance, two acoustic wave filters can be arranged as a duplexer.

An acoustic wave filter can include a plurality of acoustic resonators arranged to filter a radio frequency signal. Example acoustic wave filters include surface acoustic wave (SAW) filters and bulk acoustic wave (BAW) filters. BAW filters include BAW resonators. Example BAW resonators include film bulk acoustic wave resonators (FBARs) and BAW solidly mounted resonators (SMRs). In BAW resonators, acoustic waves propagate in a bulk of a piezoelectric layer.

Filters with steep skirts and relatively low insertion loss near band edges are typically desirable. There are technical challenges to implementing such filters.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a packaged bulk acoustic wave component that includes a bulk acoustic wave reso-nator, a terminal outside of a footprint of the bulk acoustic wave resonator, and a circuit element electrically connected to the bulk acoustic wave resonator. The bulk acoustic wave resonator includes an acoustic reflector, a first electrode, a second electrode, and a piezoelectric layer over the acoustic reflector and between the first electrode and the second electrode. The circuit element includes conductive material buried in a dielectric layer and electrically connected to the terminal. At least a portion of the circuit element is within the footprint of the bulk acoustic wave resonator.

The dielectric layer can extend under the acoustic reflec-tor.

The circuit element can be an inductor. The inductor can include two or more conductive layers buried in the dielec-tric layer. The dielectric layer can be positioned over a substrate, and the inductor can include a second conductive layer that extends farther from the substrate than the dielec-tric layer.

The circuit element can be a tuning stub. The circuit element can be a fuse element. The circuit element can be a metal-insulator-metal capacitor.

The packaged bulk acoustic wave component can include a metal insulator-metal capacitor coupled between the bulk acoustic wave resonator and the circuit element.

The dielectric layer can be positioned over a substrate. The conductive material buried in the dielectric layer can be electrically connected to the terminal by way of at least a through substrate via that extends through the substrate.

The acoustic reflector can be an air cavity.

The bulk acoustic wave resonator and the circuit element can be included in a band pass filter arranged to filter a radio frequency signal.

The conductive material buried in the dielectric layer can be thicker than the first electrode of the bulk acoustic wave resonator.

Another aspect of this disclosure is an acoustic wave filter for filtering a radio frequency signal. The acoustic wave filter includes a bulk acoustic wave resonator, a terminal outside of a footprint of the bulk acoustic wave resonator, a circuit element electrically connected to the bulk acoustic wave resonator, and a plurality of additional bulk acoustic wave resonators connected to the bulk acoustic wave reso-nator. The circuit element includes conductive material buried in a dielectric layer and electrically connected to the terminal. At least a portion of the circuit element is within the footprint of the bulk acoustic wave resonator.

The circuit element can be an inductor. The circuit ele-ment can be a tuning stub. The circuit element can be a fuse element.

The acoustic wave filter can include a metal insulator-metal capacitor coupled between the bulk acoustic wave resonator and the circuit element.

The bulk acoustic wave resonator can include an acoustic reflector. The dielectric layer can extend under the acoustic reflector.

Another aspect of this disclosure is a wireless communi-cation device that includes an antenna, a filter in commu-nication with the antenna, and a radio frequency amplifier coupled to the filter. The filter includes a bulk acoustic wave resonator, a terminal outside of a footprint of the bulk acoustic wave resonator, and a circuit element electrically connected to the bulk acoustic wave resonator. The circuit element includes conductive material buried in a dielectric layer and electrically connected to the terminal. At least a portion of the circuit element is within the footprint of the bulk acoustic wave resonator.

Another aspect of this disclosure is a bulk acoustic wave component that includes a bulk acoustic wave resonator, a circuit element electrically connected to the bulk acoustic wave resonator, and a capacitor including an electrode buried in a dielectric layer. The bulk acoustic wave resonator includes an acoustic reflector, a first electrode, a second electrode, and piezoelectric layer over the acoustic reflector and between the first electrode and the second electrode. The circuit element includes conductive material buried in the dielectric layer.

The dielectric layer can extend under the acoustic reflector.

The capacitor can be coupled to the bulk acoustic wave resonator. The capacitor can be positioned laterally relative to the acoustic reflector. The capacitor can be a metal-insulator-metal capacitor consisting of the electrode, a second electrode, and material of the dielectric layer positioned between the electrode and the second electrode.

The electrode of the capacitor can be thicker than the first electrode of the bulk acoustic wave resonator.

The circuit element can be an inductor. The circuit element can be a tuning stub. The circuit element can be a fuse element.

The bulk acoustic wave component can include a terminal located outside of a footprint of the bulk acoustic wave resonator. The circuit element can be electrically connected to the terminal.

The acoustic reflector can be an air cavity.

The bulk acoustic wave resonator, the capacitor, and the circuit element can be included in a band pass filter arranged to filter a radio frequency signal.

The capacitor can be in parallel with the bulk acoustic wave resonator. The capacitor can be in series with the bulk acoustic wave resonator.

Another aspect of this disclosure is an acoustic wave filter for filtering a radio frequency signal. The acoustic wave filter includes a bulk acoustic wave resonator, a circuit element electrically connected to the bulk acoustic wave resonator, a metal-insulator-metal capacitor including an electrode buried in a dielectric layer, and a plurality of additional bulk acoustic wave resonators connected to the bulk acoustic wave resonator. The circuit element includes conductive material buried in a dielectric layer.

The circuit element can be an inductor. The circuit element can be a tuning stub. The circuit element can be a fuse element.

The metal-insulator-metal capacitor can be connected in parallel with the bulk acoustic wave resonator.

Another aspect of this disclosure is a packaged radio frequency module that includes a filter, a power amplifier operatively coupled to the filter, and a packaging structure enclosing the filter and the power amplifier. The filter includes a bulk acoustic wave resonator, a circuit element electrically connected to the bulk acoustic wave resonator and including conductive material buried in a dielectric layer, and a metal-insulator-metal capacitor electrically including an electrode buried in the dielectric layer.

The packaged radio frequency module can include a radio frequency switch enclosed within the packaging structure.

Another aspect of this disclosure is a packaged bulk acoustic wave component that includes a bulk acoustic wave resonator including an acoustic reflector over a dielectric layer and a substrate, a top electrode, a bottom electrode, and piezoelectric layer over the acoustic reflector and positioned between the top electrode and the bottom electrode; and a heat dissipation structure including conductive material buried in the dielectric layer, the heat dissipation structure being positioned between the acoustic reflector and the substrate.

Another aspect of this disclosure is a packaged bulk acoustic wave component that includes a bulk acoustic wave resonator including an acoustic reflector over a dielectric layer and a substrate, a top electrode, a bottom electrode, and piezoelectric layer over the acoustic reflector and positioned between the top electrode and the bottom electrode; and a shielding structure including conductive material buried in the dielectric layer, the shielding structure being positioned between the acoustic reflector and the substrate.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 18/639,804, titled "BULK ACOUSTIC WAVE DEVICE STRUCTURE WITH METAL-INSULATOR-METAL CAPACITOR," filed on even date herewith, the entire disclosure of which is hereby incorporated by reference herein. The present disclosure relates to U.S. patent application Ser. No. 18/639,846, titled "FILTER WITH BULK ACOUSTIC WAVE RESONATOR IN PARALLEL WITH CAPACITOR," filed on even date herewith, the entire disclosure of which is hereby incorporated by reference herein. The present disclosure relates to U.S. patent application Ser. No. 18/639,837, titled "BULK ACOUSTIC WAVE DEVICE STRUCTURE WITH CIRCUIT ELEMENT INCLUDING BURIED CONDUCTOR," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIGS. 9A, 9B, 9C, 9D, and 9E are schematic cross-sectional diagrams that include BAW resonators and MIM capacitors of filters according to embodiments.

DETAILED DESCRIPTION OF CERTAIN EMBODIMENTS

Figure 1:
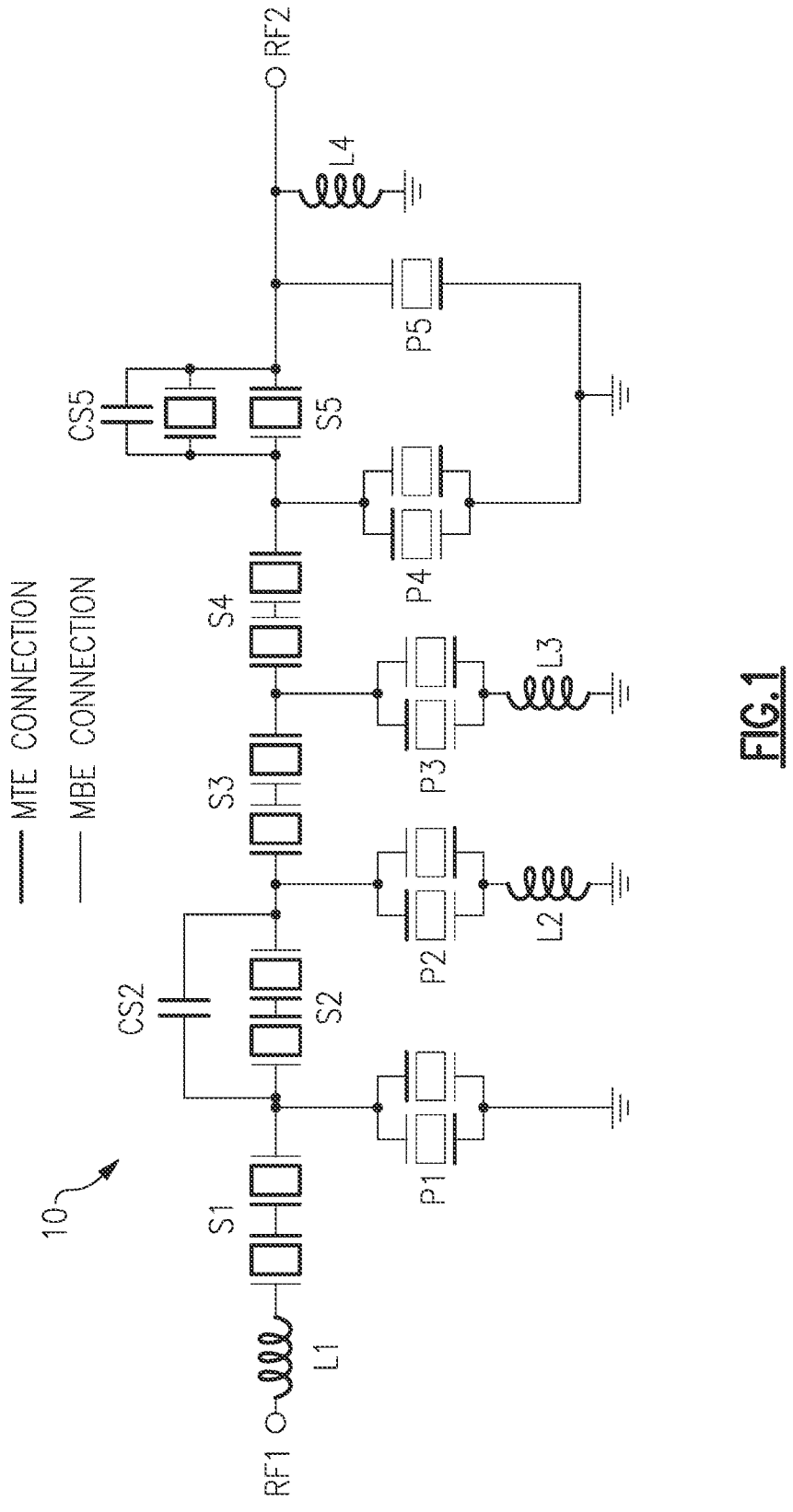
FIG. 1 is a schematic diagram of an acoustic wave filter with acoustic wave resonators and capacitors to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Band pass filters with a steep filter skirt and relatively low insertion loss near a band edge are desired for a variety of applications. Such a band pass filter can have a relatively wide passband. With a steep filter skirt, relatively high isolation can be provided for an adjacent frequency band. A band pass filter can include a plurality of acoustic wave resonators arranged in a ladder topology. In such a band pass filter, acoustic wave resonators with various electromechanical coupling coefficients $kt^2$ can achieve a steep filter skirt and relatively lower insertion loss near an edge of the passband. Capacitors can be utilized to increase the steepness of the filter skirt and maintain relatively low insertion loss near the band edge.

Certain capacitors can be implemented in acoustic wave filters for achieving the electromechanical coupling coefficients $kt^2$ desired for filter performance. Electrically connecting such a capacitor in parallel with a bulk acoustic wave resonator can achieve various electromechanical coupling coefficients $kt^2$ values to increase steepness of the filter skirt and maintain relatively low insertion loss near an edge of the passband. In certain instances, resonator capacitors can be implemented. Resonator capacitors, however, can have a lack of frequency range and/or be a relatively fragile structure susceptible to stress. As another example, metal-insulator-metal (MIM) capacitors with relatively thin electrodes can be implemented. Such capacitors can have a relatively low breakdown capability under an electrostatic discharge (ESD) event and/or have a relatively low quality factor (Q).

Aspects of this disclosure relate to MIM capacitors with an electrode buried in a dielectric layer. A buried connection metal can be under a bulk acoustic wave (BAW) resonator. The buried metal can include a bottom electrode of the MIM capacitor. In the MIM capacitor, material of the dielectric layer can be sandwiched between the buried electrode and another electrode positioned over the dielectric layer. The MIM capacitor can be electrically connected to a BAW resonator. The MIM capacitor can be positioned laterally from an acoustic reflector (e.g., an air cavity) of the BAW resonator. The dielectric layer can extend under the acoustic reflector. Buried metal can connect to one of the electrodes of the BAW resonator. The buried electrode can be relatively thick. For example, the buried electrode can be thicker than 1 micrometer. The buried electrode can have substantially constant thickness. The other electrode of the MIM capacitor can also be relatively thick. The MIM capacitor can achieve a relatively high Q using thick metal electrodes. The electromechanical coupling coefficient $kt^2$ can be controlled with variable capacitance. Different capacitances of a MIM capacitor in parallel with a BAW resonator can result in different electromechanical coupling coefficients $kt^2$. Capacitance can be based on an overlap area of electrodes of a MIM capacitor. The dielectric layer can include, but is not limited to, silicon dioxide ($SiO_2$), silicon nitride (SiN), silicon carbide (SiC), aluminum oxide ($Al_2O_3$), aluminum nitride (AlN), aluminum scandium nitride (AlScN), another suitable oxide, another suitable nitride, or another suitable oxynitride composition.

An acoustic wave filter can include a BAW resonator in parallel with a MIM capacitor having a buried electrode. The MIM capacitor can increase a steepness of a skirt of the acoustic wave filter. In certain applications, the BAW resonator can be a series resonator and the MIM capacitor can steepen an upper band edge skirt of the passband of the acoustic wave filer. In such applications, the acoustic wave filter can be a band pass filter.

Embodiments disclosed herein can achieve a variety of advantages. MIM capacitors disclosed herein can achieve higher Q than various other types of capacitors. MIM capacitors disclosed herein can achieve relatively high Q values by using thick metal for capacitor electrodes.

By using buried metal for a MIM capacitor electrode, there can be a more degrees of freedom in connecting elements of an acoustic wave filter. For example, there can be more freedom in connecting a front side pad to buried metal. As another example, there can be more freedom in connecting a back side terminal pad to buried metal.

MIM capacitors disclosed herein can be formed without additional process steps for forming the capacitors.

A relatively wide range of capacitance can be realized by varying overlap area. This can provide a relatively large electromechanical coupling coefficient $kt^2$ modification to meet design specifications.

Die size reduction can be achieved by using buried metal under a BAW resonator for a MIM capacitor. MIM capacitors disclosed herein can consume less additional die area than certain other capacitors. Filters with MIM capacitors and BAW resonators disclosed herein can be implemented with little or no additional area relative to similar filters with only BAW resonators.

Acoustic wave filters that include capacitors will now be discussed. Such filters can include MIM capacitors in accordance with any suitable principles and advantages disclosed herein.

FIG. 1 is a schematic diagram of an acoustic wave filter 10 with acoustic wave resonators and capacitors to an embodiment. The acoustic wave filter 10 can be a band pass filter. The band pass filter can have a relatively wide passband. The acoustic wave filter 10 can be a transmit filter or a receive filter. The acoustic wave filter 10 includes a plurality of acoustic wave resonators coupled between a first node RF1 and a second node RF2. The illustrated acoustic wave resonators of the acoustic wave filter 10 are BAW resonators. For example, some or all of the illustrated acoustic wave resonators can be film bulk acoustic wave resonators (FBARs). Alternatively or additionally, some or all of the illustrated acoustic wave resonators can be BAW solidly mounted resonators (SMRs). In FIG. 1, a metal top electrode (MTE) connection and a metal bottom electrode (MBE) connection are indicated for each BAW resonator.

The acoustic wave resonators are arranged in a ladder topology in the acoustic wave filter 10. The acoustic wave filter 10 includes a plurality of series filter stages S1, S2, S3, S4, and S5 and a plurality of shunt filter stages P1, P2, P3, P4, and P5. Any suitable number of series filter stages and any suitable number of shunt filter stages s can be implemented in an acoustic wave filter. Any suitable number of series resonators and any suitable number of shunt resonators can be implemented in an acoustic wave filter.

Splitting a BAW resonator into a plurality of BAW resonators can suppress second harmonic power emissions (H2) and/or increase power handling capabilities in an acoustic wave filter. For example, a series BAW resonator can be split into two anti-series BAW resonators. Anti-series BAW resonators are BAW resonators that are connected in series with each other with their polarities reversed. In FIG. 1, series filter stages S1, S2, S3, and S4 are each split into a pair of anti-series acoustic wave resonators. As another example, a shunt BAW resonator or a series BAW resonator can be split into two anti-parallel BAW resonators. Anti-parallel BAW resonators are BAW resonators that are connected in parallel with each other with their polarities reversed. In FIG. 1, series filter stage S5 and shunt filter stages P1, P2, P3, and P4 are each split into a pair of anti-parallel acoustic wave resonators. Although the acoustic wave filter 10 includes certain BAW resonators split into two resonators, a resonator can be split into any suitable number of resonators in certain applications. For instance, a BAW resonator can be split into 4 BAW resonators in some applications.

As illustrated in FIG. 1, the acoustic wave filter 10 includes a plurality of inductors L1, L2, L3, and L4 and a plurality of series capacitors Cs2 and Cs5. A capacitor in parallel with a series BAW resonator and/or a series filter stage can increase upper band edge steepness. Such a capacitor can be in parallel with a single BAW resonator, a pair of anti-series BAW resonators, or a pair of anti-parallel BAW resonators. As shown in FIG. 1, the series capacitor Cs2 is in parallel with a pair of anti-series resonators in series filter stage S2. As also shown in FIG. 1, the series capacitor Cs5 is in parallel with a pair of anti-parallel resonators in series filter stage S5. Any suitable number of series capacitors can be included in parallel with any suitable series filter stages for a particular application. The series capacitor Cs2 and/or the series capacitor Cs5 can be a MIM capacitor in accordance with any suitable principles and advantages disclosed herein. In certain applications, one or more of the inductors L1, L2, L3, or L4 can be implemented using buried metal.

The performance of the acoustic wave filter 10 can be improved by integrating capacitors Cs2 and Cs5 into the ladder network. Including series capacitors Cs2 and Cs5 in parallel with series filter stages S2 and S5, respectively, that include BAW resonators can steepen the upper filter skirt. Various capacitors can significantly increase die size by consuming additional physical area beyond acoustic wave resonators. Implementing series capacitors Cs2 and Cs5 in accordance with principles and advantages of MIM capacitors disclosed herein can consume a relatively small and/or minimal amount of die area beyond BAW resonators of series filter stages S1 to S5 and shunt filter stages P1 to P5 and also improve performance of the acoustic wave filter 10. In some instances, implementing a MIM capacitor in accordance with principles and advantages disclosed herein can consume no additional die area compared to just implementing BAW resonators of a filter.

Figure 2:
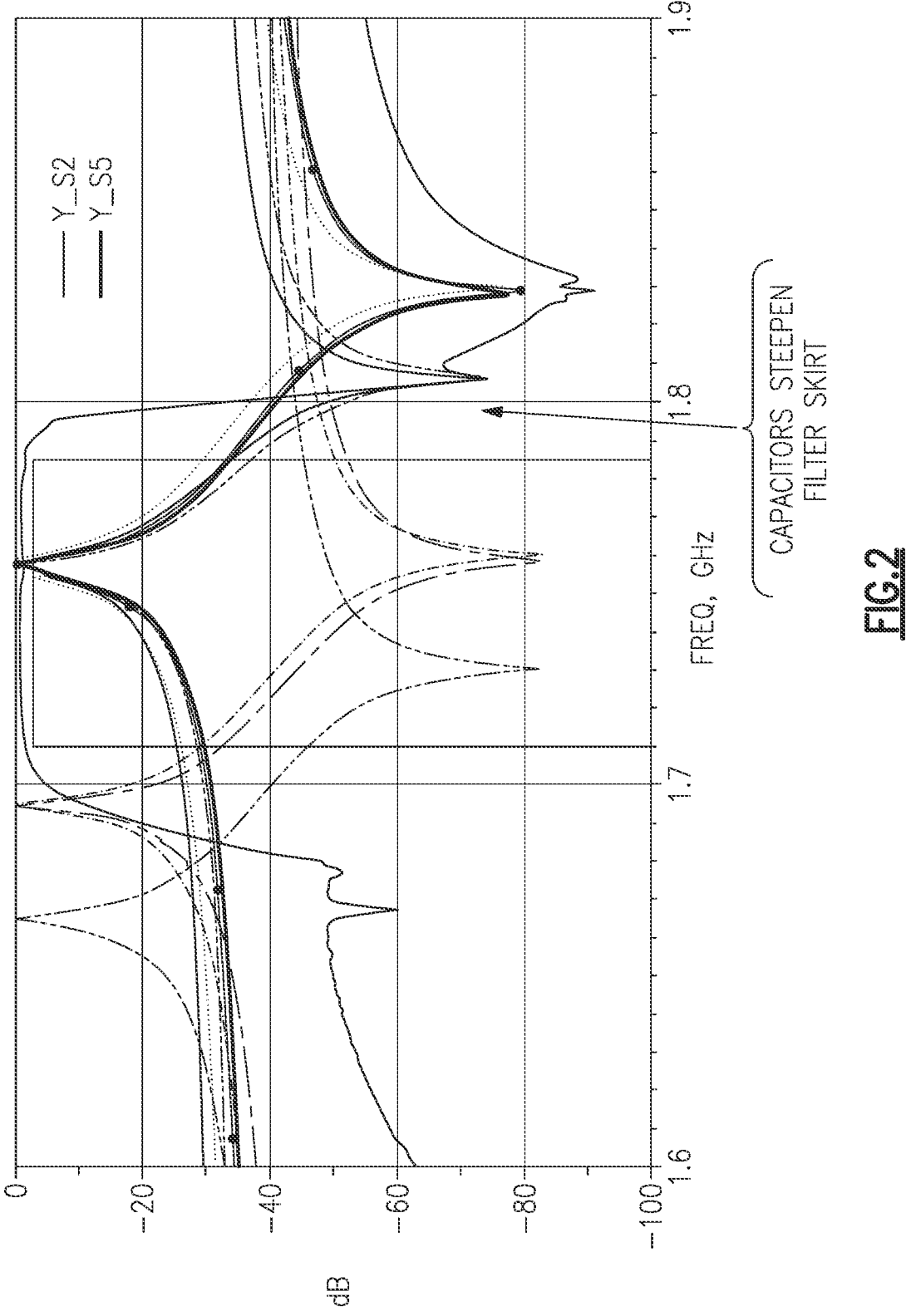
FIG. 2 is a graph of a frequency response of the acoustic wave filter of FIG. 1.

FIG. 2 is a graph of a frequency response of the acoustic wave filter 10 of FIG. 1. This graph indicates that capacitors Cs2 and Cs5 in the acoustic wave filter 10 contribute to increasing the steepness of the filter skirt at the upper band edge of the passband of the acoustic wave filter 10. With a steeper skirt, the rate at which the admittance parameter of the acoustic wave filter 10 decreases with increasing frequency at the upper band edge of the passband of the acoustic wave filter 10 increases.

The principles and advantages of increasing a steepness of a filter skirt for an upper band edge can alternatively or additionally be applied to increasing a steepness of a filter skirt for a lower band edge. A capacitor can be in parallel with one or more shunt BAW resonators to increase the steepness of the skirt for the lower band edge. The capacitor can be in parallel with a single shunt BAW resonator, a pair of shunt BAW resonators in anti-parallel with each other, a pair of shunt BAW resonators in series-parallel with each other, etc. The capacitor can be implemented in accordance with any suitable principles and advantages disclosed herein. The capacitor can be in parallel with any suitable shunt BAW resonator stage of an acoustic wave filter. In certain applications, two or more capacitors can be in parallel with any suitable respective shunt BAW resonators of an acoustic wave filter.

Figure 3:
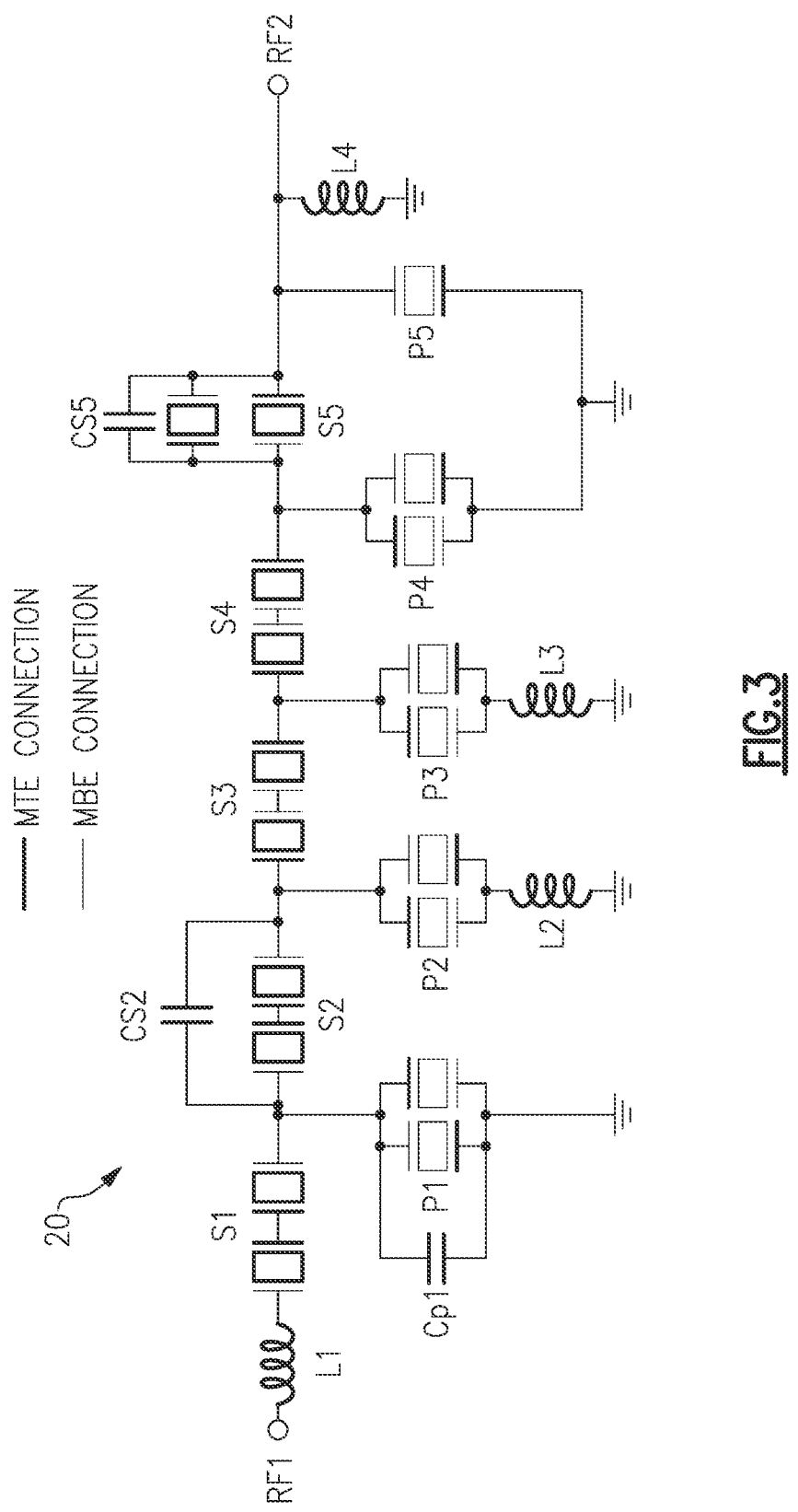
FIG. 3 is a schematic diagram of an acoustic wave filter with acoustic wave resonators and capacitors according to another embodiment.

FIG. 3 is a schematic diagram of an acoustic wave filter 20 with acoustic wave resonators and capacitors according to another embodiment. The acoustic wave filter 20 is like the acoustic wave filter 10 of FIG. 1, except than a shunt capacitor Cp1 is in parallel with a shunt filter stage P1. This can steepen a lower band edge of the acoustic wave filter 20. As illustrated, the shunt capacitor Cp1 is in parallel with anti-parallel shunt BAW resonators. The shunt capacitor Cp1 can be implemented in accordance with any suitable principles and advantages disclosed herein.

A MIM capacitor can be formed by two metal plates with a relatively thin insulating layer positioned between the two metal plates. The two metal plates can be parallel plates. MIM capacitors can achieve a relatively high capacitance density due to width and spacing of metal plates. Desirable matching characteristics can be realized due to lateral coupling. Desirable frequency characteristics and Q can be achieved by MIM capacitors disclosed herein. At the same time, MIM capacitors disclosed here can consume relatively small or no additional physical area and/or be formed without additional process steps for forming the capacitors.

MIM capacitors can be used in radio frequency circuits, such as filters arranged to filter radio frequency signals. MIM capacitors can be connected to BAW resonators in any suitable way for a particular application. For example, a MIM capacitor can be connected in parallel with a BAW resonator to increase filter steepness and/or electromechanical coupling coefficient $kt^2$. Example BAW device structures that include at least one BAW resonator and at least one MIM capacitor are described with reference to FIGS. 4A to 8B. Any suitable principles and advantages of these BAW device structures can be implemented together with each other. Any of the BAW devices structures can be implemented in any suitable acoustic wave filter, such as, but not limited to, the acoustic wave filter 10 of FIG. 1 and/or the acoustic wave filter 20 of FIG. 3. Alternatively or additionally, any of the BAW structures disclosed herein can be used in oscillators and/or any other suitable application.

Figure 4A:
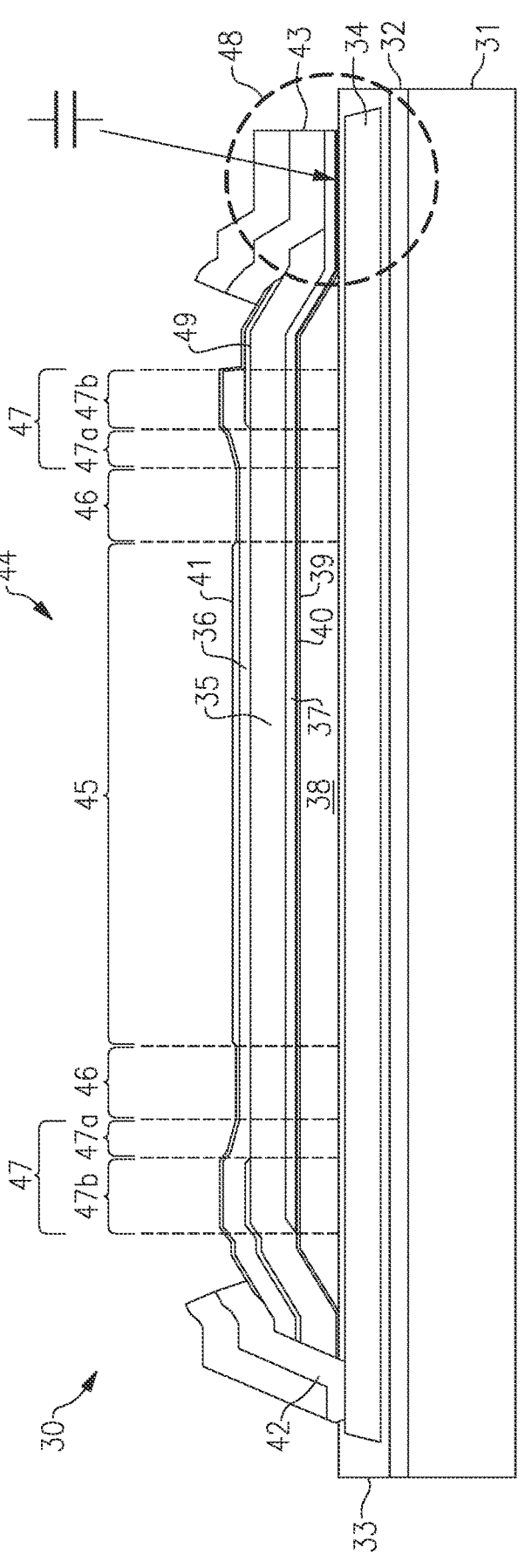
FIG. 4A is a schematic cross-sectional diagram of a bulk acoustic wave (BAW) device structure that includes a BAW resonator and a metal-insulator-metal (MIM) capacitor according to an embodiment.

FIG. 4A is a schematic cross-sectional diagram of a BAW device structure 30 that includes a BAW resonator 44 and a MIM capacitor 48 according to an embodiment. As illustrated, the BAW device structure 30 includes a substrate 31, a trap rich layer 32, a dielectric layer 33, a buried conductive layer 34, a piezoelectric layer 35, a top electrode 36, a bottom electrode 37, an air cavity 38, a lower passivation layer 39, an adhesion layer 40, an upper passivation layer 41, a first pad 42, and a second pad 43. A BAW resonator 44 includes a main acoustically active region 45, a recessed frame region 46, and a raised frame region 47. The MIM capacitor 48 is positioned laterally from the air cavity 38 in the BAW device structure 30. The MIM capacitor 48 can be implemented with little or no additional area relative to implementing only the BAW resonator 44.

The MIM capacitor 48 includes a first electrode, a second electrode, and material of the dielectric layer 33 positioned between the first electrode and the second electrode. The MIM capacitor 48 can consist of solid materials. For example, the MIM capacitor 48 can consist of the first electrode, the second electrode, and solid dielectric material between the first electrode and the second electrode. There is a relatively small distance between the first electrode and the second electrode. The MIM capacitor 48 can be a strong and robust structure. The first electrode includes conductive material of the buried conductive layer 34. The first electrode can be referred to as a buried electrode. The second electrode includes metal of the bottom electrode 37 and the second pad 43. The buried conductive layer 34 is electrically connected to the top electrode 36 by way of the first pad 42. Accordingly, the MIM capacitor 48 is electrically connected in parallel with the BAW resonator 44.

The first electrode and the second electrode of the MIM capacitor 48 are both relatively thick. For example, the first electrode is thicker than the bottom electrode 37 and also thicker than the top electrode 36. The first electrode can include conductive material of the buried conductive layer 34 that is more than 1 micrometer thick. In certain applications, the first electrode can be less than 10 micrometers or less than 5 micrometers thick. The first electrode can include conductive material of the buried conductive layer 34 that has substantially constant thickness. As another example, the second electrode is thicker than the bottom electrode 37 and also thicker than the top electrode 36. The second electrode can be more than 1 micrometer thick. In certain applications, the second electrode can be less than 10 micrometers or less than 5 micrometers thick. The thicknesses of the first and second electrodes of the MIM capacitor 48 contribute to the MIM capacitor 48 having a relatively high Q.

The capacitance of the MIM capacitor 48 is impacted by the overlap of the first electrode and the second electrode. Adjusting the overlap area can adjust capacitance of the MIM capacitor 48.

The MIM capacitor 48 can be electrically connected in parallel with the BAW resonator 44 in any suitable filter. For example, the MIM capacitor 48 can implement the series capacitor Cs5 of FIGS. 1 and/or 3 or the shunt capacitor Cp1 of FIG. 3. The MIM capacitor 48 can be electrically connected in parallel with a pair of anti-parallel BAW resonators in certain applications. The MIM capacitor 48 can be electrically connected in parallel with a single BAW resonator in some applications.

A portion of the buried conductive layer 34 serves as an electrode of the MIM capacitor 48. The buried conductive layer 34 extends under the air cavity 38. The buried conductive layer 34 can include any suitable metal layer. For example, the buried conductive layer 34 can include, but is not limited to, one or more of aluminum (Al), copper (Cu), silver (Ag), gold (Au), molybdenum (Mo), ruthenium (Ru), platinum (Pt), tungsten (W), chromium (Cr), or alloys thereof. The buried conductive layer 34 can include a relatively low resistivity material. The buried conductive layer 34 can have a relatively high melting temperature.

As illustrated in FIG. 4A, the dielectric layer 33 extends under the air cavity 38. The dielectric layer 33 can include any suitable dielectric material for providing electrical isolation for the buried conductive layer 34. The dielectric layer 33 can include any suitable dielectric material for providing an insulator for the MIM capacitor 48. The dielectric layer 33 include, but is not limited to, silicon dioxide ($SiO_2$), silicon nitride (SiN), silicon carbide (SiC), aluminum oxide ($Al_2O_3$), aluminum nitride (AlN), aluminum scandium nitride (AlScN), SiON, SiOC, SiOB, SiOP, SiOF, diamond-like carbon (DLC), nanocrystalline diamond (NCD), microcrystalline diamond (MCD), tellurium oxide (TeO), a germanium oxide (e.g., GeO or $GeO_2$), beryllium oxide (BeO), a titanium oxide (e.g., TiO), a tantalum oxide (e.g., TaO or $Ta_2O_5$), magnesium oxide (MgO), zinc oxide (ZnO), a hafnium oxide (e.g., HfO or $HfO_2$), a zirconium oxide (e.g., ZrO or $ZrO_2$), titanium nitride (TiN), tantalum nitride (TaN), another suitable oxide, another suitable nitride, or another suitable oxynitride. In certain applications, the dielectric layer 33 can include the same material as the lower passivation layer 39 and/or the upper passivation layer 41. In some other applications, the dielectric layer 33 can include different material than the lower passivation layer 39 and/or the upper passivation layer 41.

In the BAW device structure 30, an additional capacitor can include a first electrode that includes part of the buried conductive layer 34, a second electrode that includes metal of the bottom electrode 37, and the material of the dielectric layer 33 and air of the air cavity 38 that is between the first electrode and the second electrode of the additional capacitor.

Figure 4B:
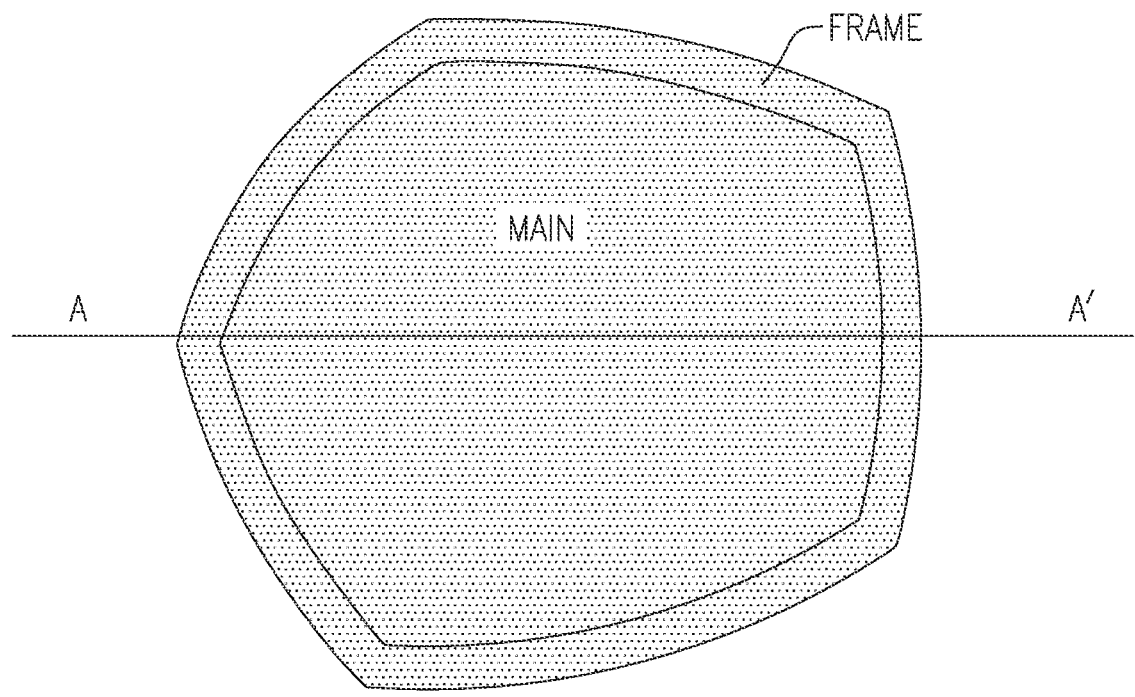
FIG. 4B is a plan view of the BAW resonator of FIG. 4A.

The BAW resonator 44 is a film bulk acoustic wave resonator (FBAR). The BAW resonator 44 can generate a bulk acoustic wave that propagates in a bulk of the piezoelectric layer 35. The illustrated BAW resonator 44 includes a main acoustically active region 45 and frame regions 46, 47 on opposing sides of the main acoustically active region 45 in the illustrated cross-sectional view. Both the main acoustically active region 45 and the frame regions 46, 47 are included over the air cavity 38 in the BAW resonator 44. There can be a significant (e.g., exponential) fall off of acoustic energy in the piezoelectric layer 35 for a main mode in the frame regions 46, 47 relative to the main acoustically active region 45. The illustrated frame regions include a recessed frame region 46 and a raised frame region 47. In the recessed frame region 46, the passivation layer 41 is thinner than in the main acoustically active region 45. The raised frame region 47 includes a first raised frame region 47a and a second raised frame region 47b. In the first raised frame region 47a, the top electrode 36 is thicker than in the main acoustically active region. The first raised frame region 47a can be referred to as a metal raised frame region. The second raised frame region 47b includes an additional layer 49 relative to the first raised frame region 47b. The additional layer 49 can include the same material as the passivation layer 41 in certain applications. When the additional layer 49 includes an oxide (e.g., SiO$_2$), the second raised frame region 47b can be referred to as an oxide raised frame region. The main acoustically active region 45 can be significantly larger than the frame regions 46, 47. FIG. 4B can show the relative sizes of the main acoustically active region 45 and the frame region 46, 47 more to scale than the cross-sectional view of FIG. 4A.

While the BAW resonator 44 includes the recessed frame region 46 and the raised frame region 47, other frame regions and/or structures can alternatively or additionally be implemented. For example, a raised frame structure with multiple layers. Such a multi-layer raised frame structure can include a layer between an electrode of a BAW device and a piezoelectric layer can be implemented. Raised frame structures can include one or more gradients. As one more example, a raised frame structure can be implemented without a recessed frame structure.

As illustrated in FIG. 4A, the BAW device structure 30 includes the support substrate 31, the trap rich layer 32, and the dielectric layer 33. The support substrate 31 can be a semiconductor substrate. The support substrate 31 can be a silicon substrate. The support substrate 31 can be any other suitable support substrate. The trap rich layer 32 can be a polysilicon layer, an amorphous silicon layer, or the like. The trap rich layer 32 is positioned between the support substrate 31 and the dielectric layer 33 in the BAW device structure 30.

The air cavity 38 of the BAW resonator 44 is an example of an acoustic reflector. As illustrated, the air cavity 38 is located above the support substrate 31. The air cavity 38 is positioned between the support substrate 31 and the bottom electrode 31. In some applications, an air cavity can be etched into a support substrate. A BAW resonator with an air cavity can be referred to as an FBAR.

In some applications, a solid acoustic mirror with alternating high acoustic impedance and low acoustic impedance layers can be implemented in place of an air cavity. A BAW resonator with a solid acoustic mirror can be referred to as a BAW SMR. Any suitable principles and advantages of MIM capacitors disclosed herein can be applied to BAW SMRs. For example, a BAW SMR can have an electrode electrically connected to a MIM capacitor that includes a buried electrode. The buried electrode of the MIM capacitor can be embedded in a dielectric layer that extends below the solid acoustic mirror of the BAW SMR. The MIM capacitor can be positioned laterally relative to the solid acoustic mirror of the BAW SMR. Any suitable structures disclosed herein that include buried conductive material below a BAW resonator can be implemented with BAW SMRs and/or any other suitable BAW resonators.

Referring to FIG. 4A, the piezoelectric layer 35 is positioned between the bottom electrode 37 and the top electrode 36. The piezoelectric layer 35 can be an aluminum nitride (AlN) layer. The piezoelectric layer 35 can be any other suitable piezoelectric layer. The first piezoelectric layer 35 can be doped with any suitable dopant, such as scandium (Sc), chromium (Cr), magnesium (Mg), sulfur(S), yttrium (Y), silicon (Si), germanium (Ge), oxygen (O), hafnium (Hf), zirconium (Zr), titanium (Ti), or the like. For example, the piezoelectric layer 35 can be an aluminum nitride layer doped with scandium. In the main acoustically active region 45, piezoelectric layer 35 overlaps with both the bottom electrode 37 and the top electrode 36 over the air cavity 38. The piezoelectric layer 35 can be in physical contact with both the bottom electrode 37 and the top electrode 36 in the main acoustically active region 45 as illustrated in certain applications. In some other applications (not illustrated), a temperature compensation layer can be positioned between the piezoelectric layer 35 and the top electrode 36 or the bottom electrode 37. The main acoustically active region 45 is also free from frame structures, such as raised frame structure and/or recessed from structures.

The bottom electrode 37 can have a relatively high acoustic impedance. For example, the bottom electrode 37 can include molybdenum (Mo), tungsten (W), ruthenium (Ru), chromium (Cr), iridium (Ir), platinum (Pt), Ir/Pt, or any suitable alloy and/or combination thereof. Similarly, the top electrode 36 can have a relatively high acoustic impedance. The top electrode 36 can include Mo, W, Ru, Ir, Cr, Pt, Ir/Pt, or any suitable alloy and/or combination thereof. The top electrode 36 can be formed of the same material as the bottom electrode 37 in certain instances. The top electrode 36 refers to the electrode farther from the substrate 31 than the piezoelectric layer 35 in the BAW resonator 44. The bottom electrode 37 refers to the electrode closer to the substrate 31 than the piezoelectric layer 35 in the BAW than the resonator 44.

The adhesion layer 40 is positioned between the bottom electrode 37 and the lower passivation layer 39. The adhesion layer 40 can be a titanium layer, for example. Passivation material 49 can be positioned between the top electrode 36 and the piezoelectric layer 35 outside of the main acoustically active region 45.

The passivation layer 41 can be referred to as an upper passivation layer. The passivation layer 41 can be a silicon dioxide layer or any other suitable passivation layer, such as aluminum oxide, silicon carbide, aluminum nitride, silicon nitride, silicon oxynitride, or the like. The passivation layer 41 can have different thicknesses in different regions of the BAW resonator 44. Part of the passivation layer 41 can form at least part of a recessed frame structure in the recessed frame region 46 and/or a raised frame structure in the raised frame region 47.

The second pad 43 is electrically connected to the bottom electrode 37 in the BAW device structure 30. The first pad 42 is electrically connected to the top electrode 36 in the BAW device structure 30. The pads 42 and 43 can provide conductive contacts to electrically connect a respective electrode of the BAW resonator 44 to one or more other BAW resonators, one or more integrated passive devices, one or more other circuit elements, one or more signal ports, the like, or any suitable combination thereof. The pads 42 and 43 can be relatively thick conductive structures.

FIG. 4B is an example plan view of the BAW resonator of FIG. 4A. Any of the BAW resonators disclosed herein can be implemented with the same or a similar shape in plan view. The cross-sectional view of FIG. 4A is along the lines from A to A' in FIG. 4B. In FIG. 4B, the main acoustically active region MAIN and the frame region FRAM are shown. As illustrated, the main acoustically active region MAIN can correspond to the majority of the area of a BAW resonator. The frame region FRAME can include the recessed frame region 46 and the raised frame region 47 of the BAW resonator of FIG. 4A. FIG. 4B illustrates the BAW resonator with a pentagon shape with curved sides in plan view. A BAW resonator in accordance with any suitable principles and advantages disclosed herein can have any other suitable shaped in plan view, such as, but not limited to, a semi-elliptical shape, an ellipsoid shape, a semi-circular shape, a circular shape, a quadrilateral shape, a quadrilateral shape with curved sides, etc.

Figure 5A:
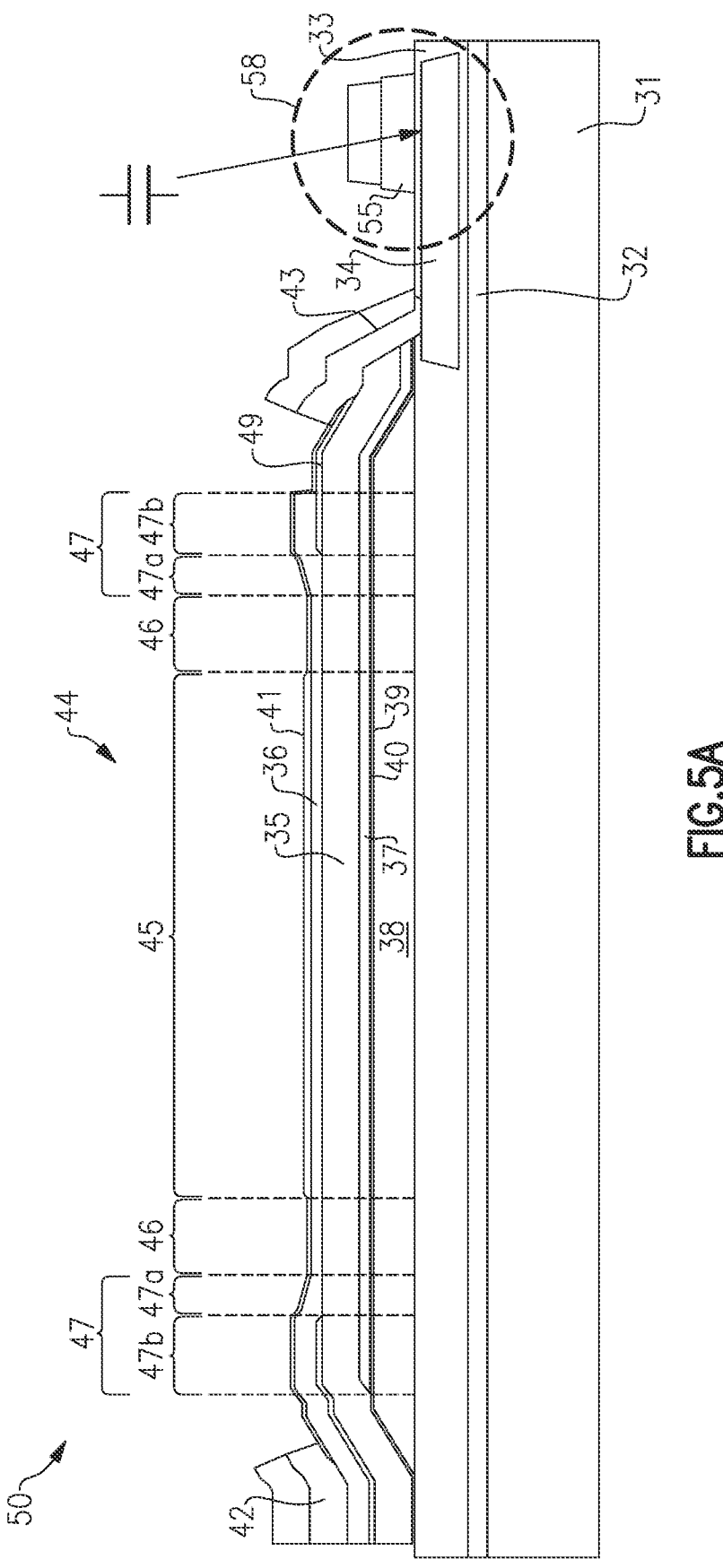
FIG. 5A is a schematic cross-sectional diagram of a BAW device structure that includes a BAW resonator and a MIM capacitor that includes a pad according to an embodiment.

FIG. 5A is a schematic cross-sectional diagram of a BAW device structure 50 that includes a BAW resonator 44 and a MIM capacitor 58 that includes a pad 55 according to an embodiment. The BAW device structure 50 is like the BAW device structure 30 of FIG. 4A, except that a different MIM capacitor is included and the MIM capacitor is electrically connected to the BAW resonator 44 differently.

The MIM capacitor 58 includes a first electrode, a second electrode, and material of the dielectric layer 33 positioned between the first electrode and the second electrode. The first electrode includes conductive material of the buried conductive layer 34. The first electrode extends laterally beyond the top electrode 36 of the BAW resonator 44. In the BAW device structure 50, the buried conductive layer 34 is not electrically connected to the top electrode 36 of the BAW resonator 44. The buried conductive layer 34 extends under the air cavity 38 in the BAW device structure 50. The first electrode of the MIM capacitor 58 is electrically connected to the bottom electrode 37 of the BAW resonator 44 in FIG. 5A. The second electrode includes metal of the pad 55. The pad 55 is relatively thick. For example, the pad 55 is thicker than the bottom electrode 37 and also thicker than the top electrode 36. The pad 55 is spaced apart from the second pad 43.

The pad 55 can serve as an electrical contact pad for connecting to the MIM capacitor 58 to another BAW resonator, another circuit element, or a terminal of a packaged acoustic wave component. For example, the pad 55 can be electrically connected to a bottom electrode of another BAW resonator electrically connected in anti-series with the BAW resonator 44 such that the MIM capacitor 58 is in parallel with the anti-series combination of the BAW resonator 44 and the other BAW resonator. In certain applications, the MIM capacitor 58 can implement the series capacitor Cs2 of FIGS. 1 and/or 3.

Packaged acoustic wave components can include a through substrate via (TSV), such as a through silicon via, to electrically connect to a terminal on an opposite side of a support substrate than a BAW resonator. In certain applications, an electrode of an MIM capacitor can be electrically connected to conductive material of a TSV. Example BAW device structures with TSVs will be discussed with reference to FIGS. 5B, 6, 7A, 7B, 8A, and 8B.

Figure 5B:
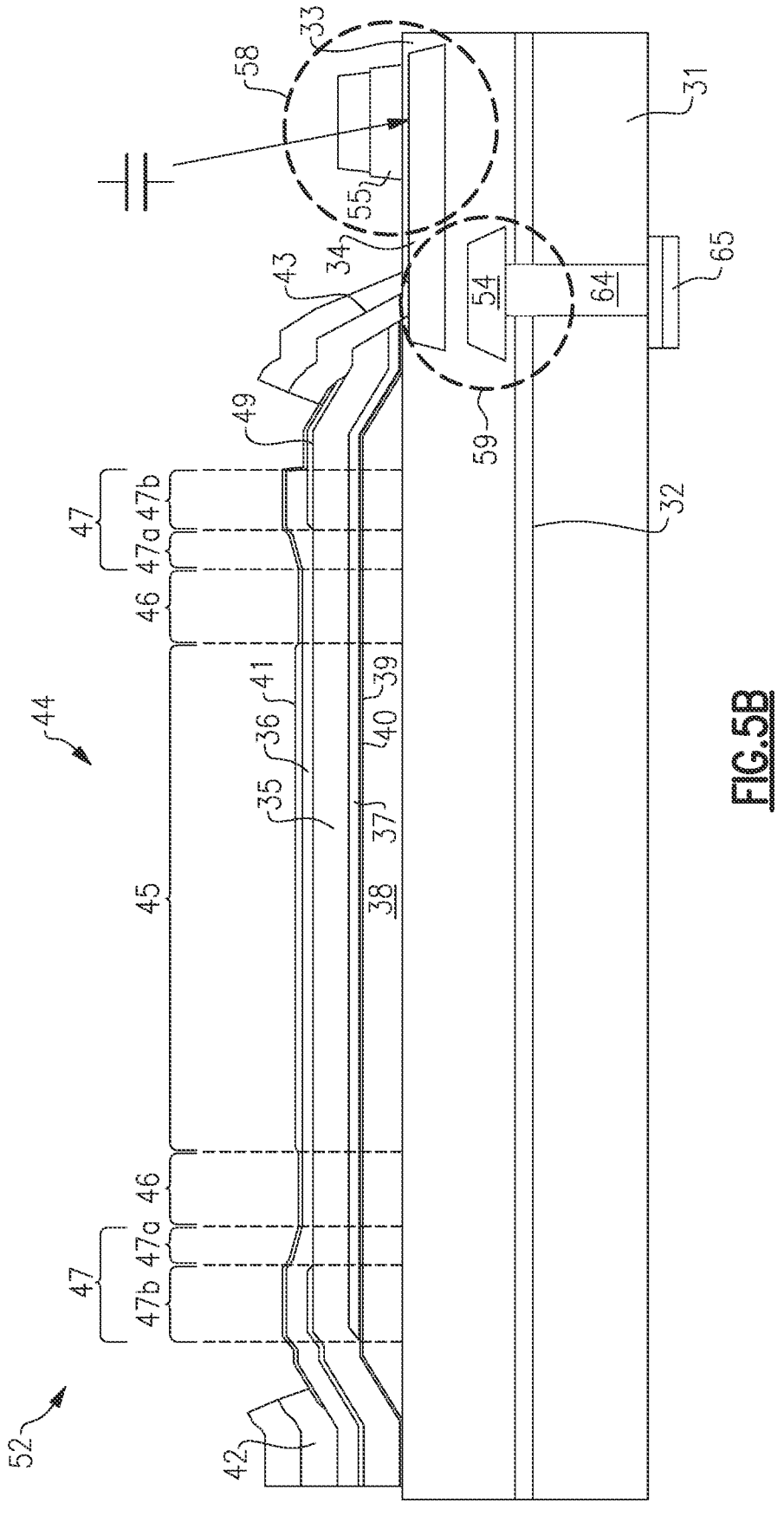
FIG. 5B is a schematic cross-sectional diagram of a BAW device structure that includes a BAW resonator and MIM capacitors.

FIG. 5B is a schematic cross-sectional diagram of a BAW device structure 52 that includes a BAW resonator 44 and MIM capacitors 58 and 59. The BAW device structure 52 is like the BAW device structure 50 of FIG. 5A, except that the BAW device structure 52 additionally includes MIM capacitor 59, a TSV 64, and a terminal pad 65.

In the BAW device structure 52, the MIM capacitor 59 includes conductive material of two buried conductive layers 34 and 54 and dielectric material of the dielectric layer 33 positioned therebetween. The MIM capacitor 59 includes a first electrode that includes conductive material of the buried conductive layer 34, a second electrode that includes conductive material of the buried conductive layer 54, and material of the dielectric layer 33 positioned between the electrodes. The second electrode of the MIM capacitor 59 is connected to the terminal pad 65 by way of TSV 64.

According to some applications, a dielectric layer below a BAW resonator can include two or more buried conductive layers and a MIM capacitor can include conductive material of two different buried conductive layers. A first electrode of a MIM capacitor can include conductive material of a first buried conductive layer and a second electrode of the MIM capacitor can include conductive material of a second buried conductive layer. Material of the dielectric layer positioned between the first and second electrodes of the MIM capacitor can be the dielectric of the MIM capacitor.

Figure 6:
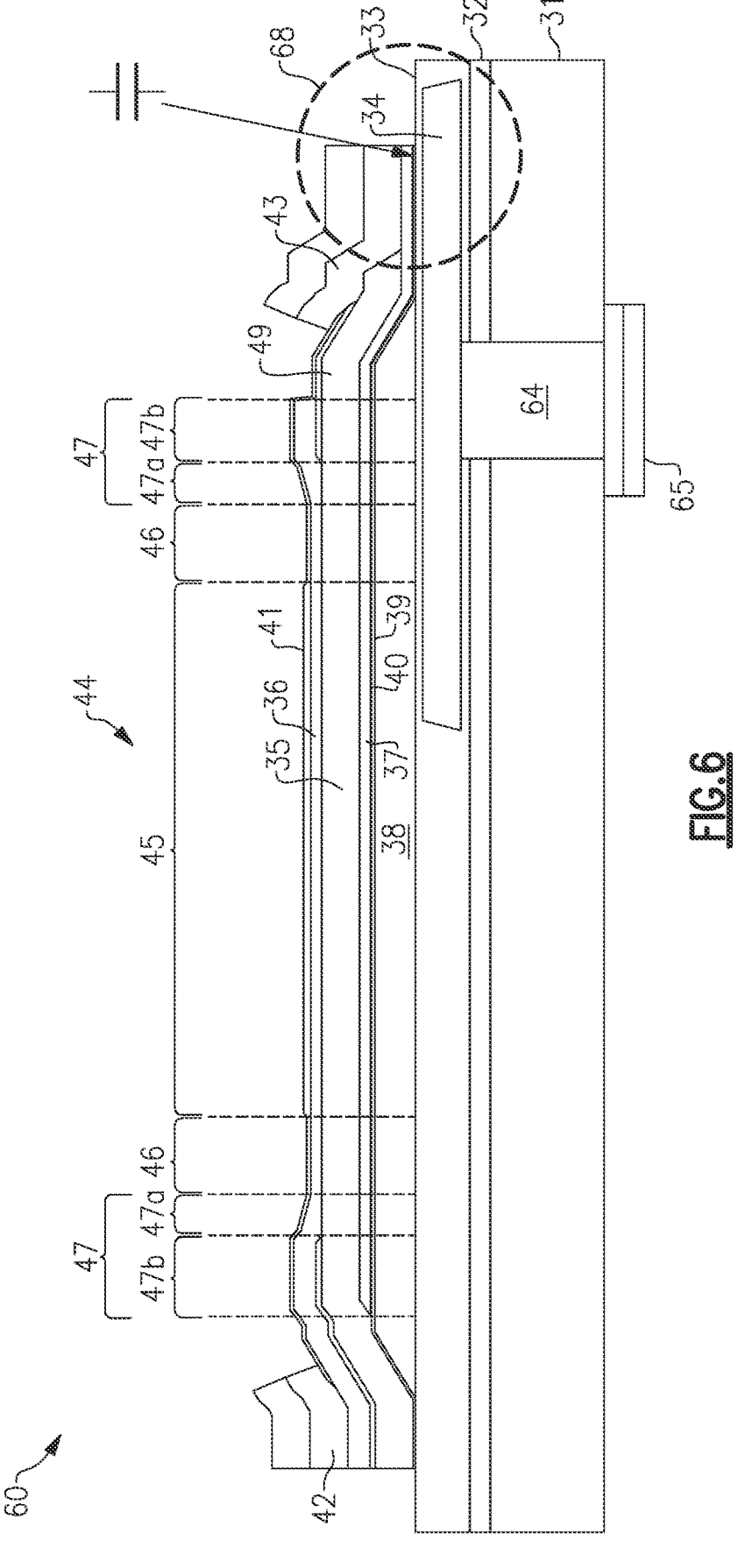
FIG. 6 is a schematic cross-sectional diagram of a BAW device structure that includes a BAW resonator and a MIM capacitor connected to a through substrate via according to an embodiment.

FIG. 6 is a schematic cross-sectional diagram of a BAW device structure 60 that includes a BAW resonator 44 and a MIM capacitor 68 connected to a through substrate via 64 according to an embodiment. The BAW device structure 60 is like the BAW device structure 30 of FIG. 4A, except that a different MIM capacitor is included and the MIM capacitor is electrically connected to the BAW resonator 44 differently.

The MIM capacitor 68 includes a first electrode, a second electrode, and material of the dielectric layer 33 positioned between the first electrode and the second electrode. The first electrode includes conductive material of the buried conductive layer 34. The first electrode of the MIM capacitor 68 is electrically connected to conductive material of a terminal pad 65 by way of conductive material of a TSV 64. The terminal pad 65 can be any suitable contact pad for a packaged acoustic wave component. The terminal pad 65 can be mostly of fully within a footprint of the BAW resonator 44. The second electrode includes metal of the bottom electrode 37 and the second pad 43 in the BAW device structure 60. The MIM capacitor 68 is coupled between the bottom electrode 37 of the BAW resonator and the terminal pad 65.

The terminal pad 65 can serve as an electrical contact pad for connecting to the MIM capacitor 68 external to a packaged acoustic wave component. The MIM capacitor 68 can be a series capacitor in a ladder filter in certain applications. In some other applications, the terminal pad 65 can be connected to a ground potential. In such applications, the MIM capacitor 68 can be a shunt capacitor.

Figure 7A:
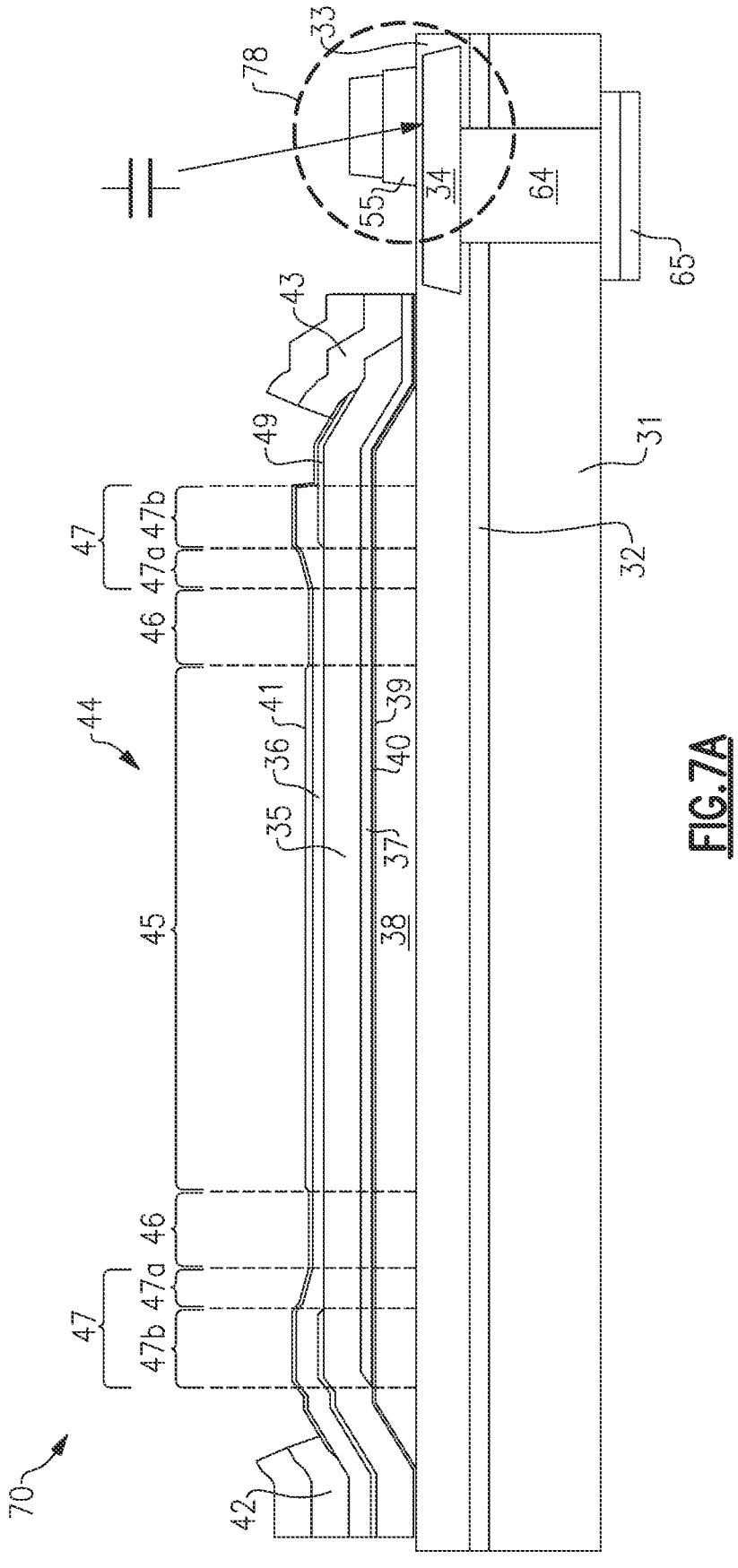
FIG. 7A is a schematic cross-sectional diagram of a BAW device structure that includes a BAW resonator and a MIM capacitor according to another embodiment.

FIG. 7A is a schematic cross-sectional diagram of a BAW device structure 70 that includes a BAW resonator 44 and a MIM capacitor 78 according to another embodiment. The BAW device structure 70 includes a different MIM capacitor than the BAW device structure 60 of FIG. 6. In the BAW device structure 70, the MIM capacitor 78 is not connected to the BAW resonator 44 and the terminal pad 65 is outside of the footprint of the BAW resonator 44.

The MIM capacitor 78 includes a first electrode, a second electrode, and material of the dielectric layer 33 positioned between the first electrode and the second electrode. The first electrode includes conductive material of the buried conductive layer 34. The first electrode of the MIM capacitor 78 is electrically connected to conductive material of a terminal pad 65 by way of conductive material of a TSV 64. The second electrode includes metal of the pad 55. The pad 55 can be spaced apart from the second pad 43.

Figure 7B:
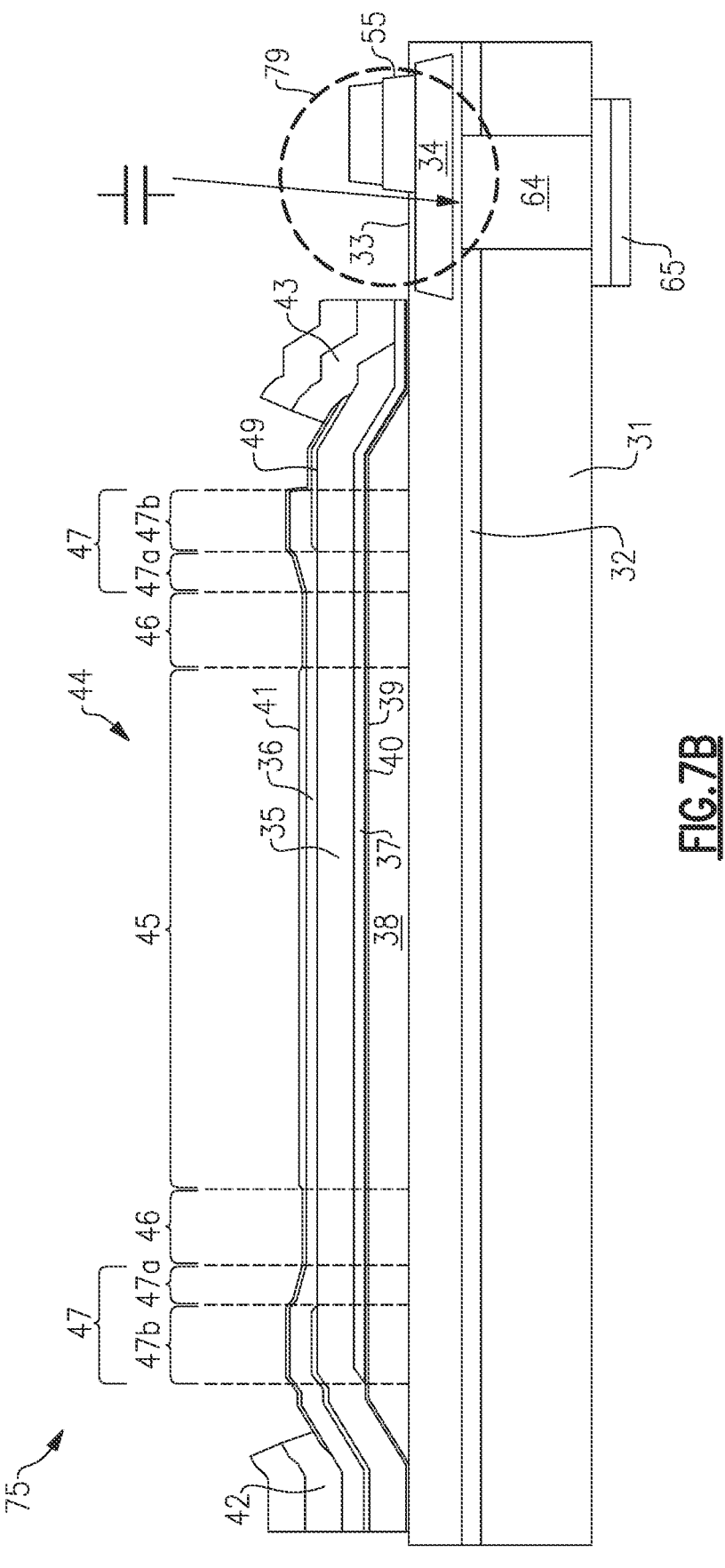
FIG. 7B is a schematic cross-sectional diagram of a BAW device structure that includes a BAW resonator and a MIM capacitor with a dielectric below a buried electrode according to another embodiment.

FIG. 7B is a schematic cross-sectional diagram of a BAW device structure 75 that includes a BAW resonator 44 and a MIM capacitor 79 with a dielectric below a buried electrode according to an embodiment. In the MIM capacitor 79, first electrode includes conductive material of the TSV 64, the second electrode includes conductive material of the buried conductive layer 34. The BAW device structure 75 is an example of conductive material of buried conductive layer 34 and dielectric material of the dielectric layer 33 positioned between the buried conductive layer 34 and the substrate 31 being included in an MIM capacitor. Dielectric material under a buried conductive layer can be an insulator of an MIM capacitor in accordance with any suitable principles and advantages disclosed herein.

Figure 8A:
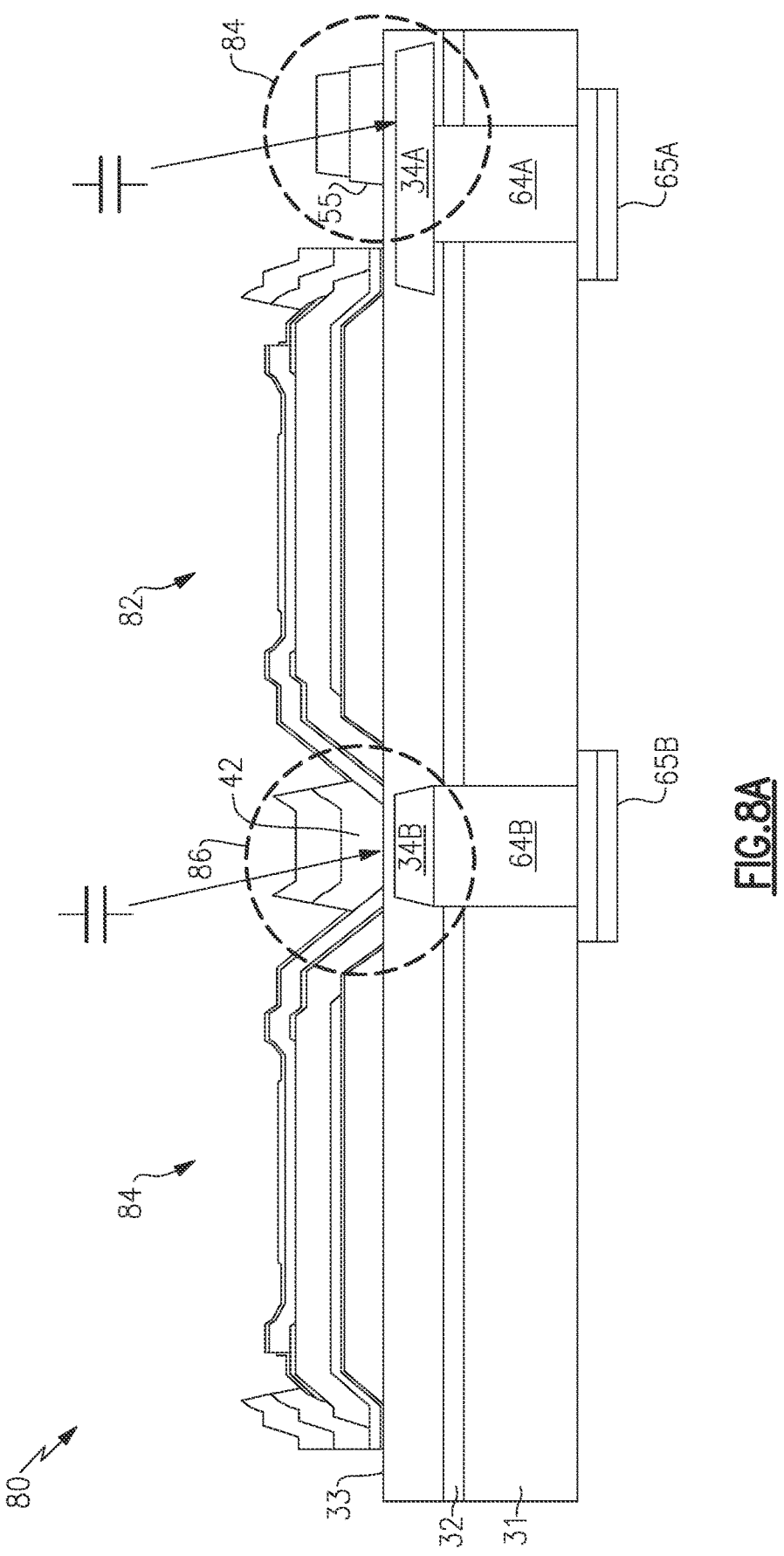
FIG. 8A is a schematic cross-sectional diagram of a BAW device structure that includes BAW resonators and MIM capacitors according to an embodiment.

FIG. 8A is a schematic cross-sectional diagram of a BAW device structure 80 that includes BAW resonators 82 and 83 and MIM capacitors 84 and 86 according to an embodiment. The BAW device structure 80 is an example of a plurality of MIM capacitors being implemented in a packaged component. While two MIM capacitors are shown in FIG. 8A, any suitable number of MIM capacitors can be implemented in packaged component that includes BAW resonators. The MIM capacitors 84 and 86 are examples of MIM capacitors that can be implemented with buried metal located adjacent to and/or between BAW resonators. The MIM capacitors 84 and 86 are electrically connected to respective TSVs 64A and 64B and terminal pads 65A and 65B. The TSVs 64A and 64B and terminal pads 65A and 65B are located laterally from acoustic reflectors of BAW resonators 82 and 83. The TSVs 64A and 64B and terminal pads 65A and 65B are non-overlapping with acoustic reflectors of BAW resonators 82 and 83 as illustrated.

A first MIM capacitor 84 includes a first electrode, material of the dielectric layer 33, and a second electrode. The first electrode includes conductive material of the buried conductive layer 34A. The first electrode is electrically connected to a first terminal pad 65A by way of a first TSV 64A. The second electrode includes metal of the pad 55 that is positioned over the dielectric layer 33. The first MIM capacitor 84 is positioned laterally from the BAW resonator 82. The first MIM capacitor 84 is outside of a footprint of the BAW resonator 82. The first MIM capacitor 84 does not overlap with the acoustic reflector of the BAW resonator 82. The first MIM capacitor 84 can be connected to one or more BAW resonators of an acoustic wave filter in any suitable way.

A second MIM capacitor 86 includes a first electrode, material of the dielectric layer 33, and a second electrode. The first electrode includes conductive material of the buried conductive layer 34B. The buried conductive layer 34B is electrically connected to a second terminal pad 65B by way of a second TSV 64B. The second electrode includes metal of the pad 42. The pad 42 is electrically connected to top electrodes of the BAW resonators 82 and 83. The second MIM capacitor 86 is positioned laterally in between the BAW resonators 82 and 83. The second MIM capacitor 86 is outside of a footprint of each of the BAW resonators 82 and 83. The second MIM capacitor 86 does not overlap with the acoustic reflectors of either of the BAW resonators 82 and 83. The second MIM capacitor 86 is an example of a MIM capacitor that is electrically connected to an electrode of two BAW resonators. In FIG. 8A, the second MIM capacitor 86 has a second electrode that is connected to the same polarity electrode of BAW resonator 82 and the BAW resonator 83. The second MIM capacitor 86 can be included in any suitable filter topology. As one example, the second MIM capacitor 86 can be electrically connected between a second terminal 65B at ground and a node between a pair of anti-series BAW resonators in a filter stage (e.g., stage S1 and/or S2 in FIGS. 1 and/or 3). Such a capacitor can contribute to H2 suppression.

Figure 8B:
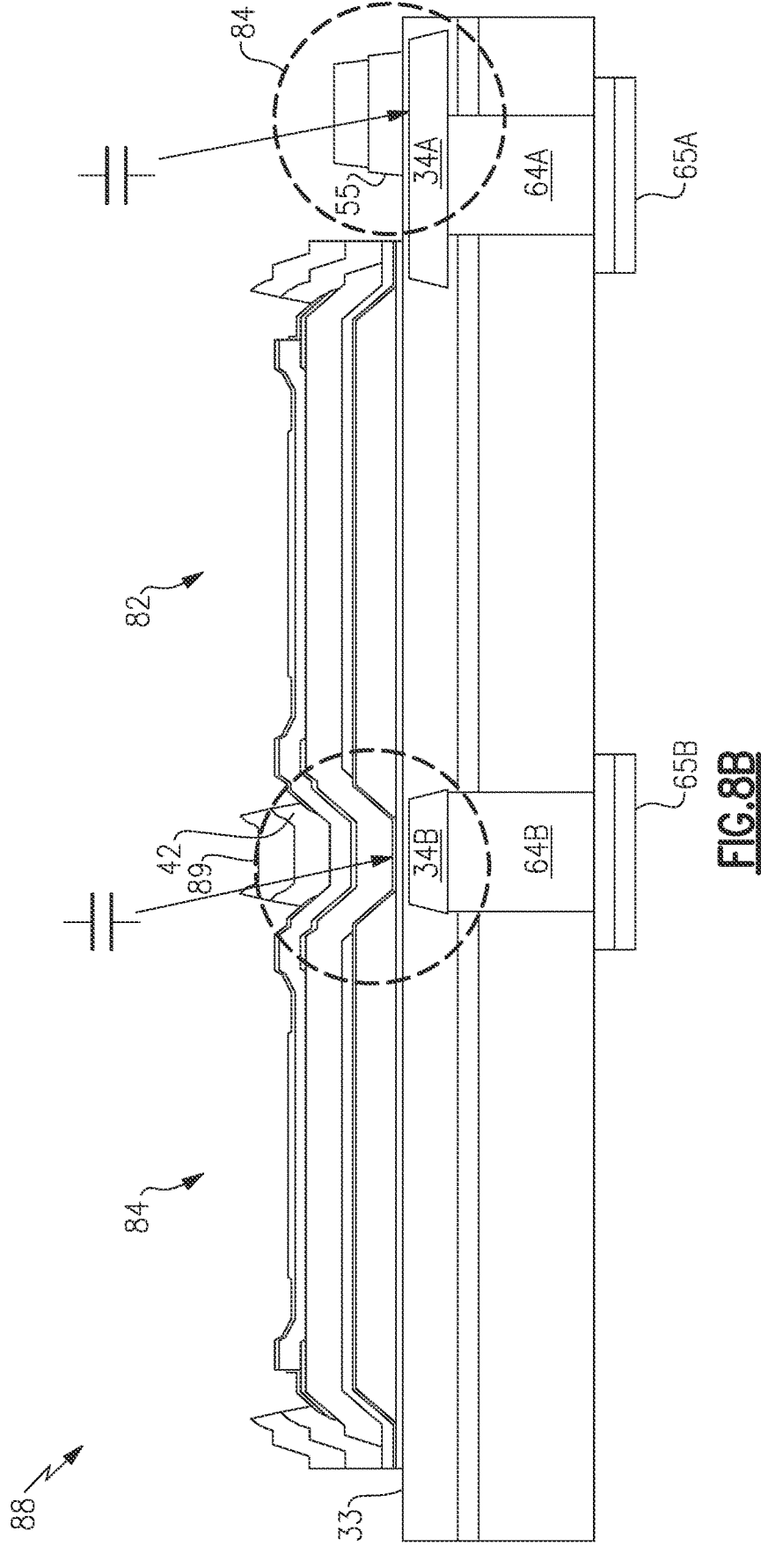
FIG. 8B is a schematic cross-sectional diagram of a BAW device structure that includes BAW resonators and MIM capacitors according to an embodiment.

FIG. 8B is a schematic cross-sectional diagram of a BAW device structure 88 that includes BAW resonators 82 and 84 and MIM capacitors 84 and 89 according to an embodiment. The MIM capacitor 89 is like the MIM capacitor 86 of FIG. 8A, except that the MIM capacitor 89 additionally includes material of a top electrode and a piezoelectric layer.

The BAW devices structures disclosed herein can be implemented in a variety of filter that filter radio frequency signals. FIGS. 9A, 9B, 9C, 9D, and 9E are schematic cross-sectional diagrams that include BAW resonators and MIM capacitors of filters according to embodiments.

FIG. 9A is a schematic cross-sectional diagram of a BAW device structure 90 according to an embodiment. The BAW device structure 90 includes a first BAW resonator 92, an MIM capacitor 48 in parallel with the first BAW resonator 92, a second BAW resonator 93, and a third BAW resonator 94. Buried conductive structures 34A, 34B, and 34C are included between a substrate 31 and respective BAW resonators 92, 93, and 94. The BAW resonators 92, 93, and 94 and the MIM capacitor 48 can be included in a filter. The filter can filter a radio frequency signal. The filter can include one or more other BAW resonators and/or one or more other MIM capacitors.

FIG. 9B is a schematic cross-sectional diagram of a BAW device structure 95 according to an embodiment. The BAW device structure 95 includes a first BAW resonator 92, an MIM capacitor 58, a second BAW resonator 93, and a third BAW resonator 94. Buried conductive structures 34A, 34B, and 34C are included between a substrate 31 and respective BAW resonators 92, 93, and 94. The MIM capacitor 58 can be in series with the first BAW resonator 92. The BAW resonators 92, 93, and 94 and the MIM capacitor 58 can be included in a filter. The filter can filter a radio frequency signal. The filter can include one or more other BAW resonators and/or one or more other MIM capacitors.

FIG. 9C is a schematic cross-sectional diagram of a BAW device structure 96 according to an embodiment. The BAW device structure 96 includes a first BAW resonator 92, an MIM capacitor 68, a second BAW resonator 93, and a third BAW resonator 94. Buried conductive structures 34A, 34B, and 34C are included between a substrate 31 and respective BAW resonators 92, 93, and 94. The BAW resonators 92, 93, and 94 and the MIM capacitor 68 can be included in a filter. The filter can filter a radio frequency signal. The filter can include one or more other BAW resonators and/or one or more other MIM capacitors.

FIG. 9D is a schematic cross-sectional diagram of a BAW device structure 96 according to an embodiment. The BAW device structure 97 includes a first BAW resonator 92, an MIM capacitor 98, a second BAW resonator 93, and a third BAW resonator 94. Buried conductive structures 34A, 34B, and 34C are included between a substrate 31 and respective BAW resonators 92, 93, and 94. The BAW resonators 92, 93, and 94 and the MIM capacitor 98 can be included in a filter. The filter can filter a radio frequency signal. The filter can include one or more other BAW resonators and/or one or more other MIM capacitors.

Figure 9E:
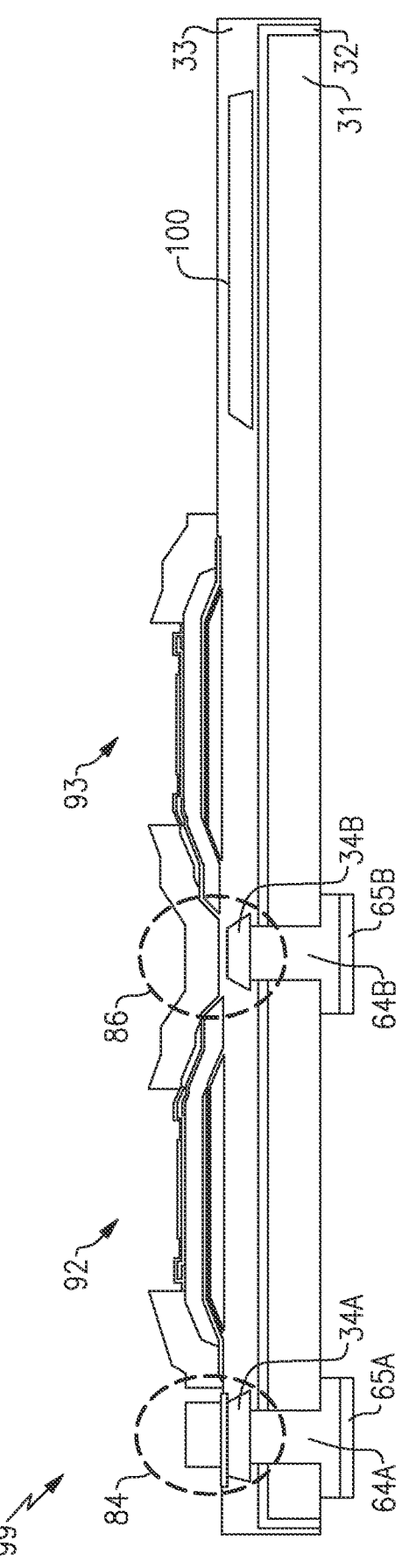

FIG. 9E is a schematic cross-sectional diagram of a BAW device structure 99 according to an embodiment. The BAW device structure 99 includes a first BAW resonator 92, an MIM capacitor 84, a second BAW resonator 93, a second MIM capacitor 86, and a circuit element 100 of buried conductive material. The circuit element 100 can be an inductor, for example. The circuit element 100 can be any other suitable circuit element that includes conductive material. The BAW resonators 92 and 93, the MIM capacitors 84 and 86, and the circuit element 100 can be included in a filter. The filter can filter a radio frequency signal. The filter can include one or more other BAW resonators, one or more other MIM capacitors, one or more other circuit elements, or any suitable combination thereof.

MIM capacitors with an electrode that includes conductive material of a buried conductive layer are described with reference to FIGS. 4A to 8B. The shape and/or function of buried conductive layer(s) can be leveraged to achieve other functionality. Buried conductive material in a dielectric layer can alternatively or additionally be used to form other circuit elements and/or useful structures in a packaged component that includes BAW resonators. For example, one or more inductors, one or more tuning stubs, one or more fuse elements such as e-fuses, one or more shielding structures, one or more heat dissipation structures such as one or more heat spreaders and/or one or more heat sinks, or the like can be implemented by one or more buried conductive layers in dielectric material. Such circuit elements can be electrically connected to one or more BAW resonators of a filter. A shielding structure can include conductive material of buried conductive layer(s) to provide shielding for and/or from BAW resonators and/or other circuit elements of a packaged component. A heat dissipation structure can include conductive material of buried conductive layer(s) to provide dissipate heat generated by BAW resonators.

FIGS. 10A to 12 illustrate example circuit elements that include conductive material of one or more buried conductive layers. Any suitable principles and advantages of these circuit elements can be implemented together with each other. Any suitable principles and advantages of these circuit elements can be implemented with any suitable principles and advantages of the MIM capacitors disclosed herein.

Figures 10A, 10B:
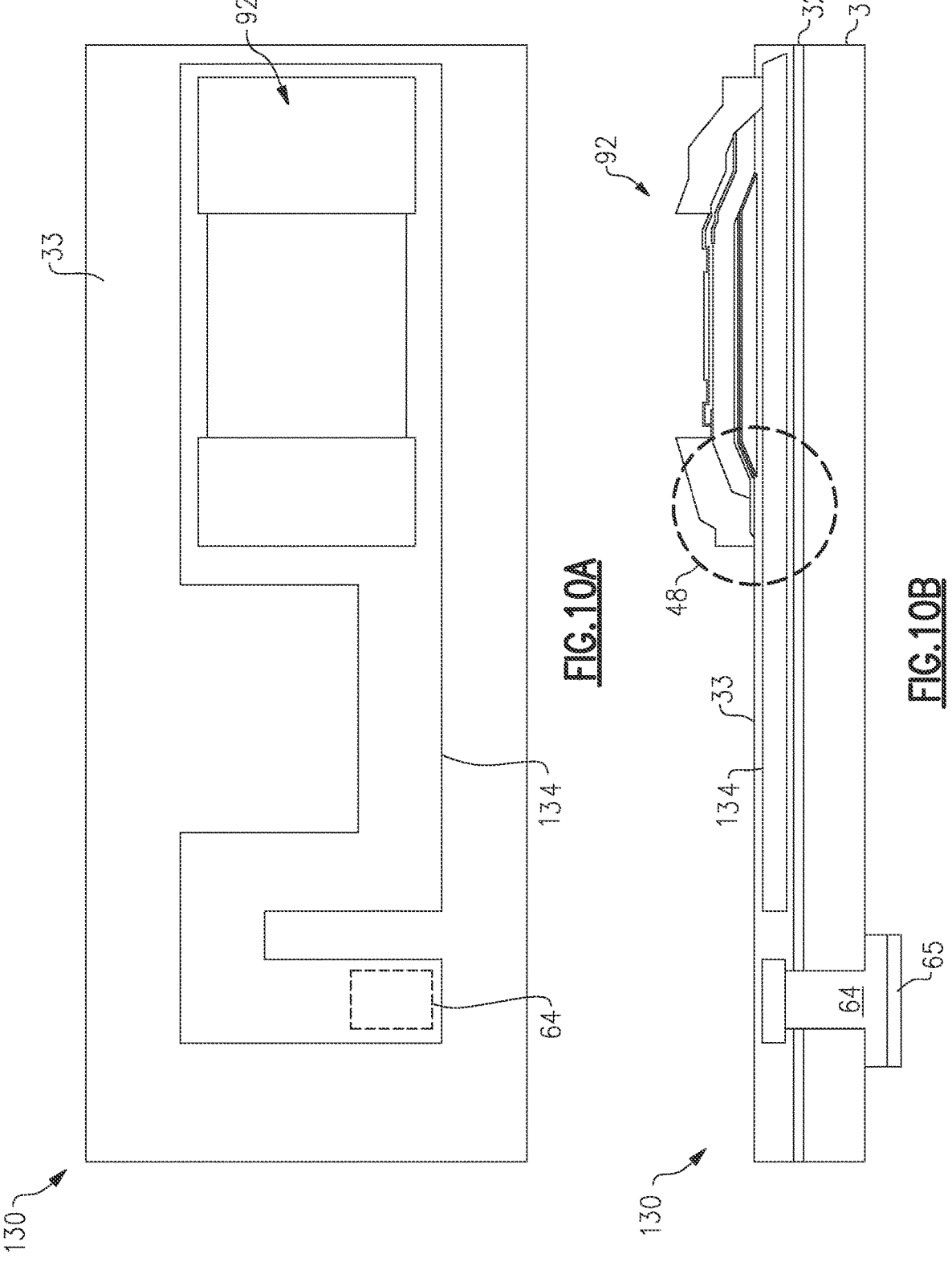
FIG. 10A is a schematic plan view of a BAW device structure that includes a BAW resonator, a MIM capacitor, and an inductor that includes buried metal according to an embodiment.
FIG. 10B is a schematic cross-sectional view of the BAW device structure of FIG. 10A.

FIG. 10A is a schematic plan view of a BAW device structure 130 that includes a BAW resonator 92 and an inductor 134 that includes buried metal according to an embodiment. The BAW device structure 130 can also include a MIM capacitor 48. FIG. 10B is a schematic cross-sectional view of the BAW device structure 130 of FIG. 10A. The inductor 134 is shaped from metal of a buried conductive layer embedded in a dielectric layer 33. The illustrated inductor 134 extends laterally beyond the BAW resonator 92. The inductor 134 can electrically connect to a terminal pad 65 that is positioned laterally relative to the BAW resonator 92. Conductive material of the inductor 134 is spaced apart from the trap rich layer 32 by material of the dielectric layer 33. As illustrated in FIG. 10B, the MIM capacitor 48 is in parallel with the BAW resonator 92 in the BAW device structure 130.

The inductor 134 can be electrically connected to an electrode of the BAW resonator 92. For example, the inductor 134 can be electrically connected to the top electrode of the BAW resonator 92 as illustrated. The inductor 134 can be electrically connected to the terminal pad 65 by way of a TSV 64. Accordingly, the inductor 134 is electrically connected between an electrode of the BAW resonator 92 and the terminal pad 65 in FIGS. 10A and 10B. The terminal pad 65 is outside of the footprint of the BAW resonator 92.

In certain applications, the inductor 134 can implement a shunt inductor between the BAW resonator 92 and ground when the terminal pad 65 is connected to ground. In such applications, the inductor 134 can implement the inductor L4 in FIGS. 1 and/or 3, for example. According to some other applications, the inductor 134 can be a series inductor electrically connected between an electrode of the BAW resonator 92 and an input terminal or an output terminal of a filter that includes the BAW resonator 92.

According to some applications, a dielectric layer that extends below an acoustic reflector of a BAW resonator can include two or more buried conductive layers. The two or more buried conductive layers can form one or more circuit elements (e.g., one or more inductors and/or one or more capacitors), provide signal routing and/or electrical connections, provide any other suitable functionality, or any suitable combination thereof. For example, a coil inductor can be implemented by a plurality of buried conductive layers. Alternatively or additionally, an inductor can include conductive material of a buried conductive layer and metal of a conductive layer that is not buried. An inductor that includes conductive material in a plurality of conductive layers can be implemented in accordance with any suitable principles and advantages of the inductor 134 of FIGS. 10A and 10B.

Figures 10C, 10D:
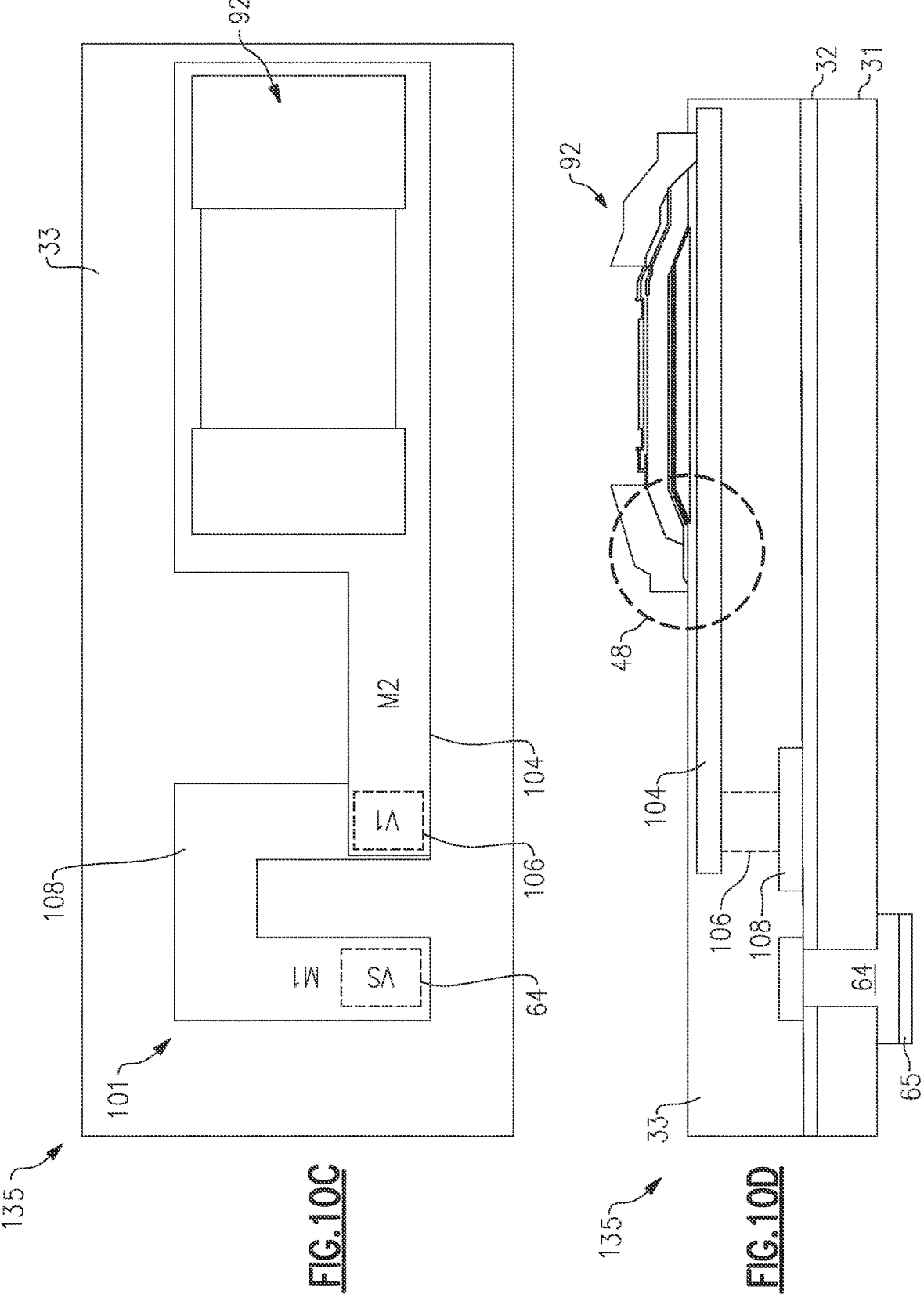
FIG. 10C is a schematic plan view of a BAW device structure that includes a BAW resonator, a MIM capacitor, and an inductor that includes buried metal in a plurality of layers according to an embodiment.
FIG. 10D is a schematic cross-sectional view of the BAW device structure of FIG. 10C.

FIG. 10C is a schematic plan view of a BAW device structure 135 that includes a BAW resonator 92 and an inductor 101 that includes buried metal in a plurality of conductive layers 104, 108 according to an embodiment. The BAW device structure 135 can also include a MIM capacitor 48. FIG. 10D is a schematic cross-sectional view of the BAW device structure 135 of FIG. 10C. As illustrated in FIGS. 10C and 10D, an inductor 101 can include conductive material of buried conductive layers 104 and 108. The buried conductive layers 104 and 108 can be electrically connected by a via 106. The inductor 101 illustrated in FIGS. 10C and 10D is electrically connected between an electrode of the BAW resonator 92 and a terminal pad 65.

Figures 10E, 10F:
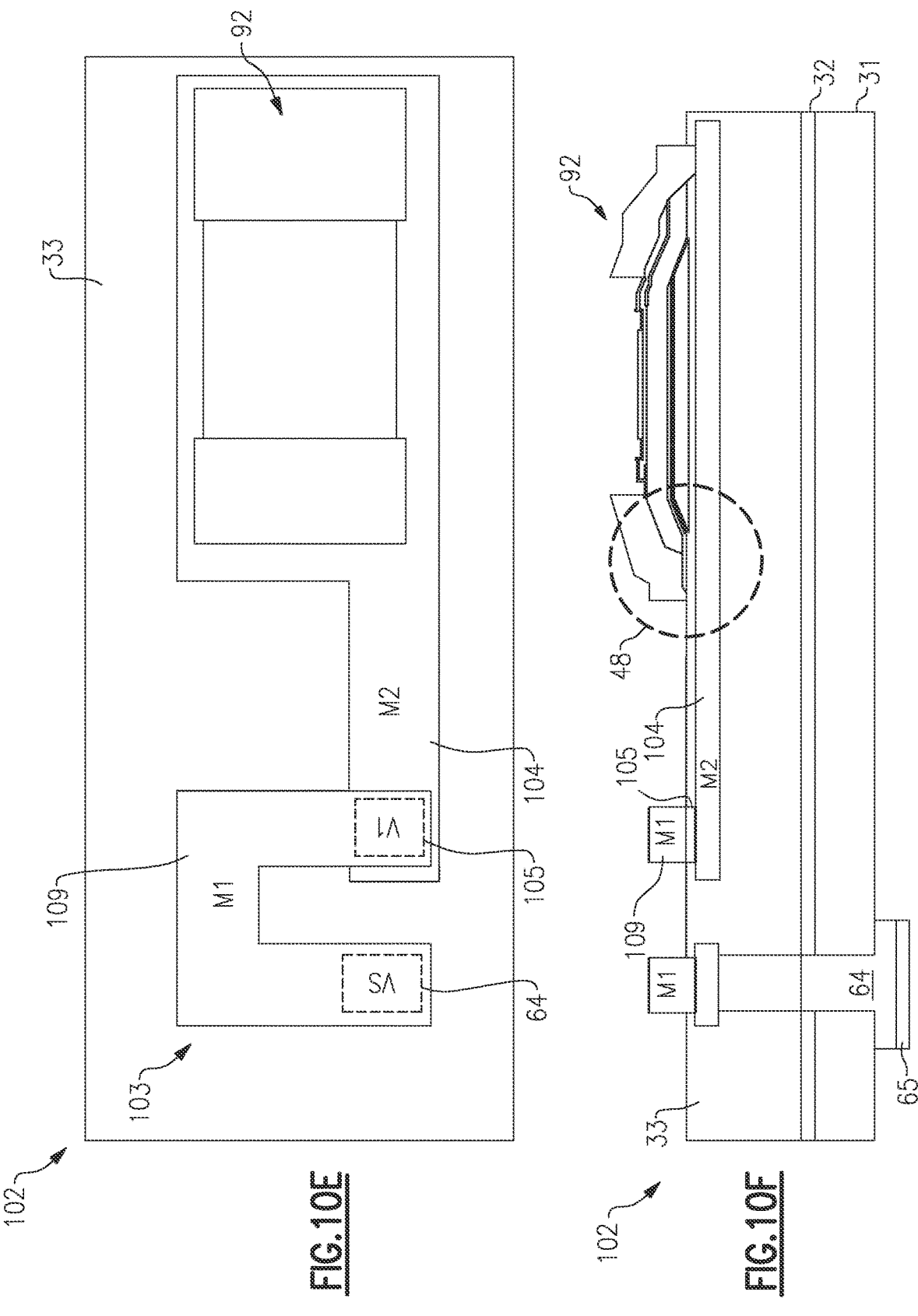
FIG. 10E is a schematic plan view of a BAW device structure that includes a BAW resonator, a MIM capacitor, and an inductor that includes a buried metal layer and another layer over the buried metal layer according to an embodiment.
FIG. 10F is a schematic cross-sectional view of the BAW device structure of FIG. 10E.
Figures 11A, 11B:
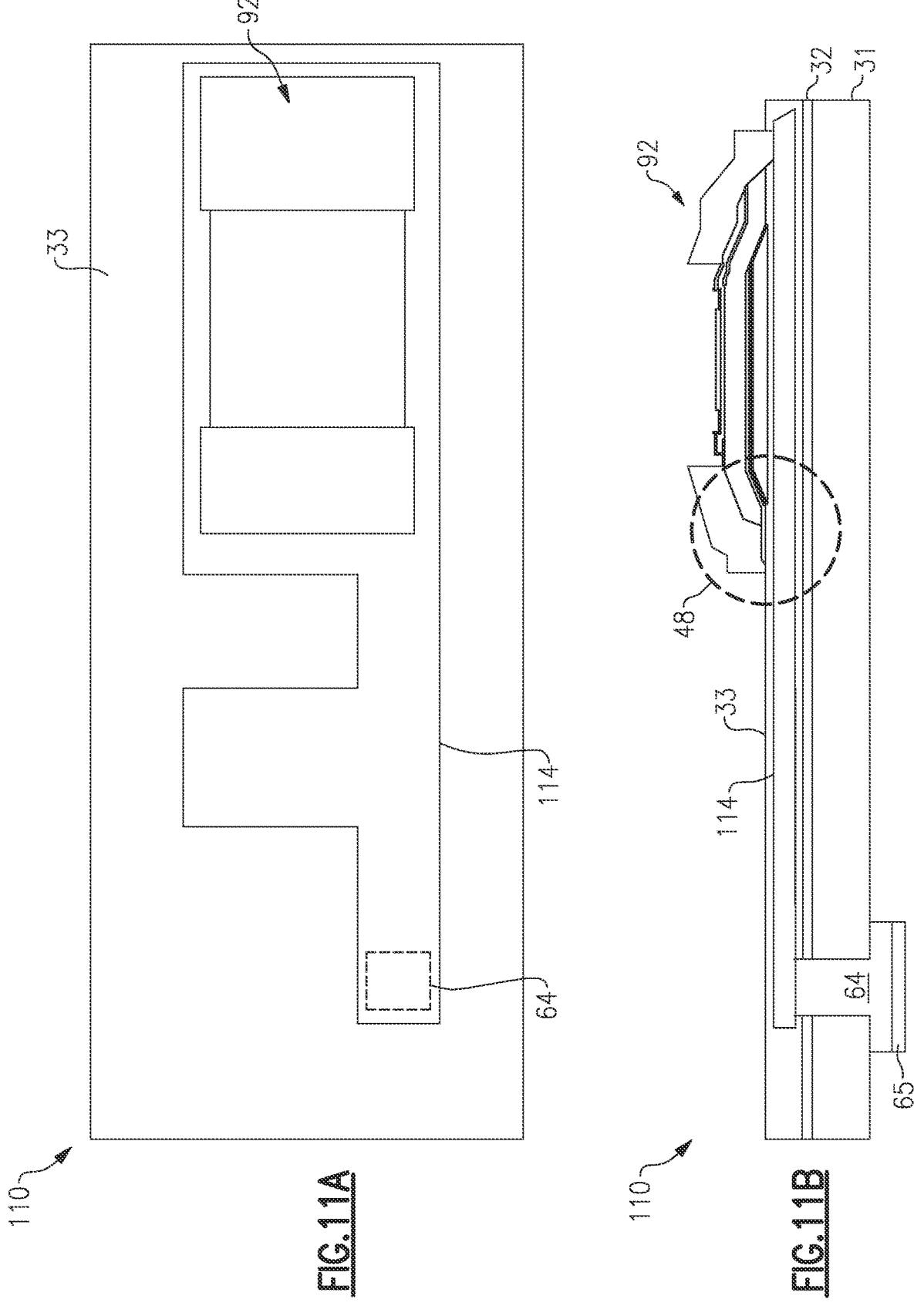
FIG. 11A is a schematic plan view of a BAW device structure that includes a BAW resonator, a MIM capacitor, and a tuning stub that includes buried metal according to an embodiment.
FIG. 11B is a schematic cross-sectional view of the BAW device structure of FIG. 11A.
Figure 12:
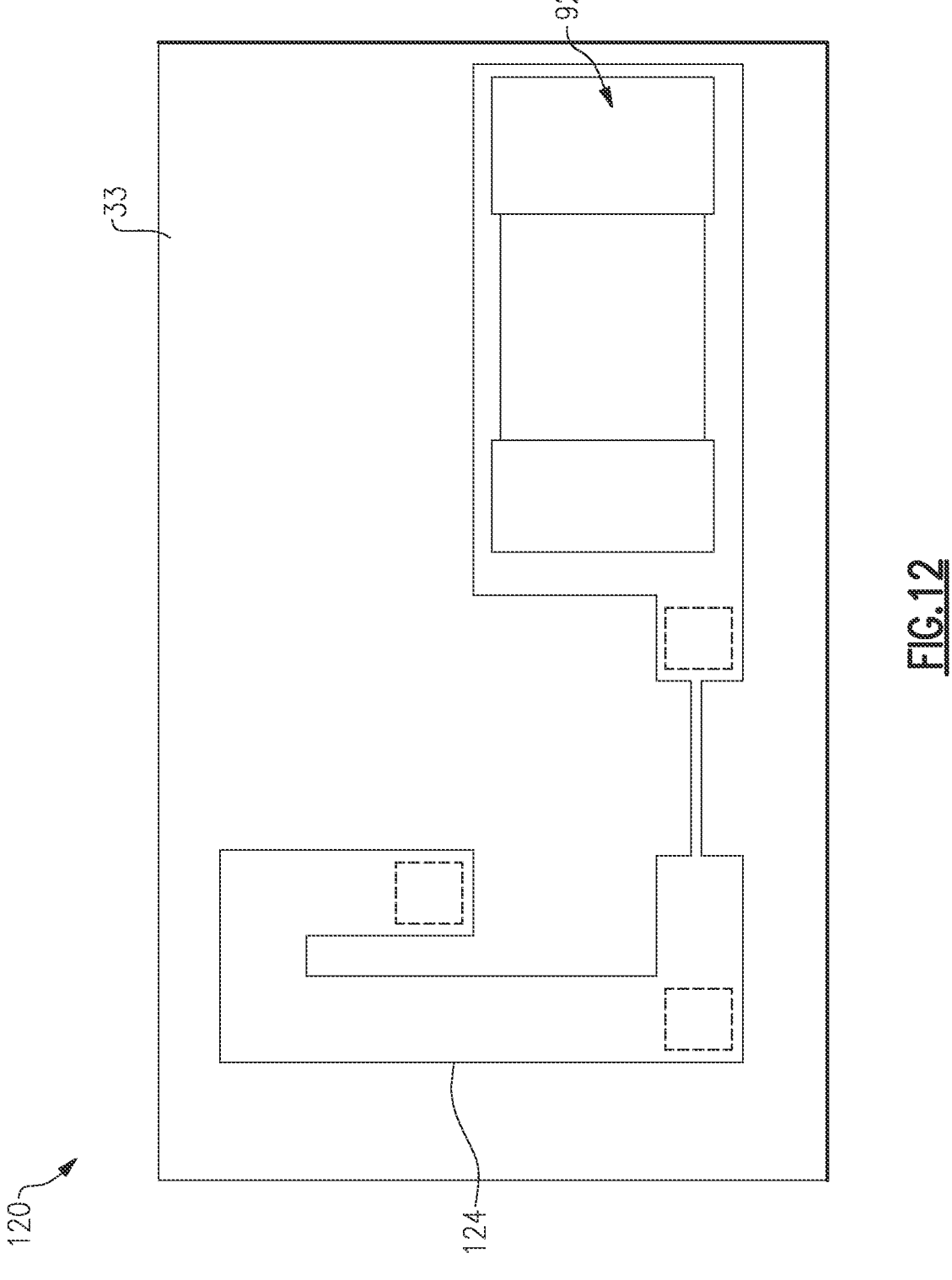
FIG. 12 is a schematic plan view of a BAW device structure that includes a BAW resonator and an e-fuse according to an embodiment.

FIG. 10E is a schematic plan view of a BAW device structure 102 that includes a BAW resonator 92, a MIM capacitor 48, and an inductor 103 that includes a buried metal in conductive layer 104 and metal of conductive layer 109 that is positioned over the conductive layer 104. The conductive layers 104 and 109 can be electrically connected. A via 105 can electrically connect the conductive layers 104 and 109. The conductive layer 109 extends farther from the substrate 31 than the dielectric layer 33 in the BAW device structure 102. The conductive layer 109 can be over the dielectric layer 33. The inductor 103 is like the inductor 101 of FIG. 10C, except that the via 105 electrically connects the buried metal in the conductive layer 104 to the conductive layer 109 that is over the dielectric layer 33 in the inductor 103. In addition, metal extending through the dielectric layer to the conductive layer 104 connects the TSV 64 to metal in the conductive layer 104 of the inductor 103. The inductor 103 includes metal buried in the dielectric layer 33 and metal over the dielectric layer 33, while the inductor 101 of FIG. 10C includes metal in two different layers buried in the dielectric layer 33. FIG. 10F is a schematic cross-sectional view of the BAW device structure 110' of FIG. 10E.

FIG. 11A is a schematic plan view of a BAW device structure 110 that includes a BAW resonator 92 and a tuning stub 114 that includes buried metal according to an embodiment. The BAW device structure 110 can also include a MIM capacitor 48. FIG. 11B is a schematic cross-sectional view of the BAW device structure 110 of FIG. 11A. The tuning stub 114 can be electrically connected to an electrode of the BAW resonator 92. For example, the tuning stub 114 can be electrically connected to the top electrode of the BAW resonator 92 as illustrated. The tuning stub 114 is electrically connected to a terminal pad 65 by way of TSV 64. The tuning stub 114 can provide a length of a transmission line that is connected at one end. The tuning stub 114 can be used for impedance matching.

FIG. 12 is a schematic plan view of a BAW device structure 120 that includes a BAW resonator 92 and an e-fuse 124 according to an embodiment. The e-fuse 124 is an example of a fuse element. Buried metal in a dielectric layer 33 below the BAW resonator 92 can be shaped for an e-fuse 124. The e-fuse 124 can electrically connect or electrically disconnect additional circuitry or a signal path to the BAW resonator 92. The e-fuse 124 can be blown at a tester or at a wafer level with probes. An e-fuse 124 is an example of programmability that can be realized by one or more buried conductive layer(s). Other programmability can alternatively or additionally be implemented using one or more conductive layers buried in a dielectric layer below a BAW resonator.

Buried metal can have chamfered corners. Any of the circuit elements that include buried metal disclosed herein can have chamfered corners. Chamfered corners can reduce electric field strength at corners of the buried metal and/or prevent a relatively high electric field from accumulating at the corners of the buried metal. This can lead to more uniform capacitance values in MIM capacitors that include buried metal.

The principles and advantages disclosed herein can be implemented in a standalone filter and/or in one or more filters in any suitable multiplexer. The filter can be a band pass filter arranged to filter a fourth generation (4G) Long Term Evolution (LTE) band and/or a fifth generation (5G) New Radio (NR) band. Any suitable principles and advantages disclosed herein can be implemented in a receive filter. Any suitable principles and advantages disclosed herein can be implemented in a transmit filter. In some applications, two or more filters of a multiplexer can be implemented in accordance with any suitable principles and advantages disclosed herein. Examples of a standalone filter and multiplexers will be discussed with reference to FIGS. 13A to 13E. Any suitable principles and advantages of these filters and/or multiplexers can be implemented together with each other.

FIG. 13A is schematic diagram of an acoustic wave filter 160. The acoustic wave filter 160 can be implemented in accordance with any suitable principles and advantages disclosed herein. The acoustic wave filter 160 is a band pass filter. The acoustic wave filter 160 is arranged to filter a radio frequency signal. The acoustic wave filter 160 includes acoustic wave resonators coupled between a first input/output port RF_IN and a second input/output port RF_OUT. The acoustic wave filter 160 can also include a capacitor and/or one or more other circuit elements that include buried metal in accordance with any suitable principles and advantages disclosed herein. The acoustic wave filter 160 has a passband and provides rejection outside of the passband.

FIG. 13B is a schematic diagram of a duplexer 162 that includes an acoustic wave filter according to an embodiment. The duplexer 162 includes a first filter 160A and a second filter 160B coupled to together at a common node COM. One of the filters of the duplexer 162 can be a transmit filter and the other of the filters of the duplexer 162 can be a receive filter. In some other instances, such as in a diversity receive application, the duplexer 162 can include two receive filters. Alternatively, the duplexer 162 can include two transmit filters. The common node COM can be an antenna node.

The first filter 160A is an acoustic wave filter arranged to filter a radio frequency signal. The first filter 160A includes one or more acoustic wave resonators coupled between a first radio frequency node RF1 and the common node COM. The first radio frequency node RF1 can be a transmit node or a receive node. The first filter 160A can include acoustic wave resonators and a circuit element that includes buried metal in accordance with any suitable principles and advantages disclosed herein. For example, the first filter 160A can include BAW resonators and one or more MIM capacitors in accordance with any suitable principles and advantages disclosed herein.

The second filter 160B can be any suitable filter arranged to filter a second radio frequency signal. The second filter 160B can be, for example, an acoustic wave filter, a filter that includes acoustic wave resonators and a circuit element that includes buried metal in accordance with any suitable principles and advantages disclosed herein, an LC filter, a hybrid acoustic wave LC filter, or the like. The second filter 160B is coupled between a second radio frequency node RF2 and the common node. The second radio frequency node RF2 can be a transmit node or a receive node.

Although example embodiments may be discussed with filters or duplexers for illustrative purposes, any suitable principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. Multiplexers can include filters having different passbands. Multiplexers can include any suitable number of transmit filters and any suitable number of receive filters. For example, a multiplexer can include all receive filters, all transmit filters, or one or more transmit filters and one or more receive filters. One or more filters of a multiplexer can be implanted in accordance with any suitable principles and advantages disclosed herein.

FIG. 13C is a schematic diagram of a multiplexer 164 that includes a filter according to an embodiment. The multiplexer 164 includes a plurality of filters 160A to 160N coupled together at a common node COM. The plurality of filters can include any suitable number of filters including, for example, 3 filters, 4 filters, 5 filters, 6 filters, 7 filters, 8 filters, or more filters. Some or all of the plurality of filters can be acoustic wave filters. As illustrated, the filters 160A to 160N each have a fixed electrical connection to the common node COM. This can be referred to as hard multiplexing or fixed multiplexing. Filters have fixed electrical connections to the common node in hard multiplexing applications.

The first filter 160A is an acoustic wave filter arranged to filter a radio frequency signal. The first filter 160A can include one or more acoustic wave devices coupled between a first radio frequency node RF1 and the common node COM. The first radio frequency node RF1 can be a transmit node or a receive node. The first filter 160A can be a filter that includes acoustic wave resonators and one or more circuit elements that include buried metal (e.g., one or more MIM capacitors) in accordance with any suitable principles and advantages disclosed herein. The other filter(s) of the multiplexer 164 can include one or more acoustic wave filters, one or more filters that include acoustic wave resonators and one or more circuit elements that include buried metal (e.g., one or more MIM capacitors) in accordance with any suitable principles and advantages disclosed herein, one or more LC filters, one or more hybrid acoustic wave LC filters, the like, or any suitable combination thereof.

Figure 13A:
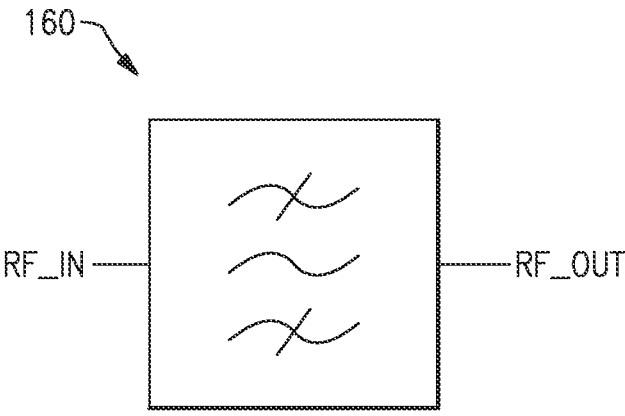
FIG. 13A is schematic diagram of a band pass filter.
Figures 13B, 13C, 13D, 13E:
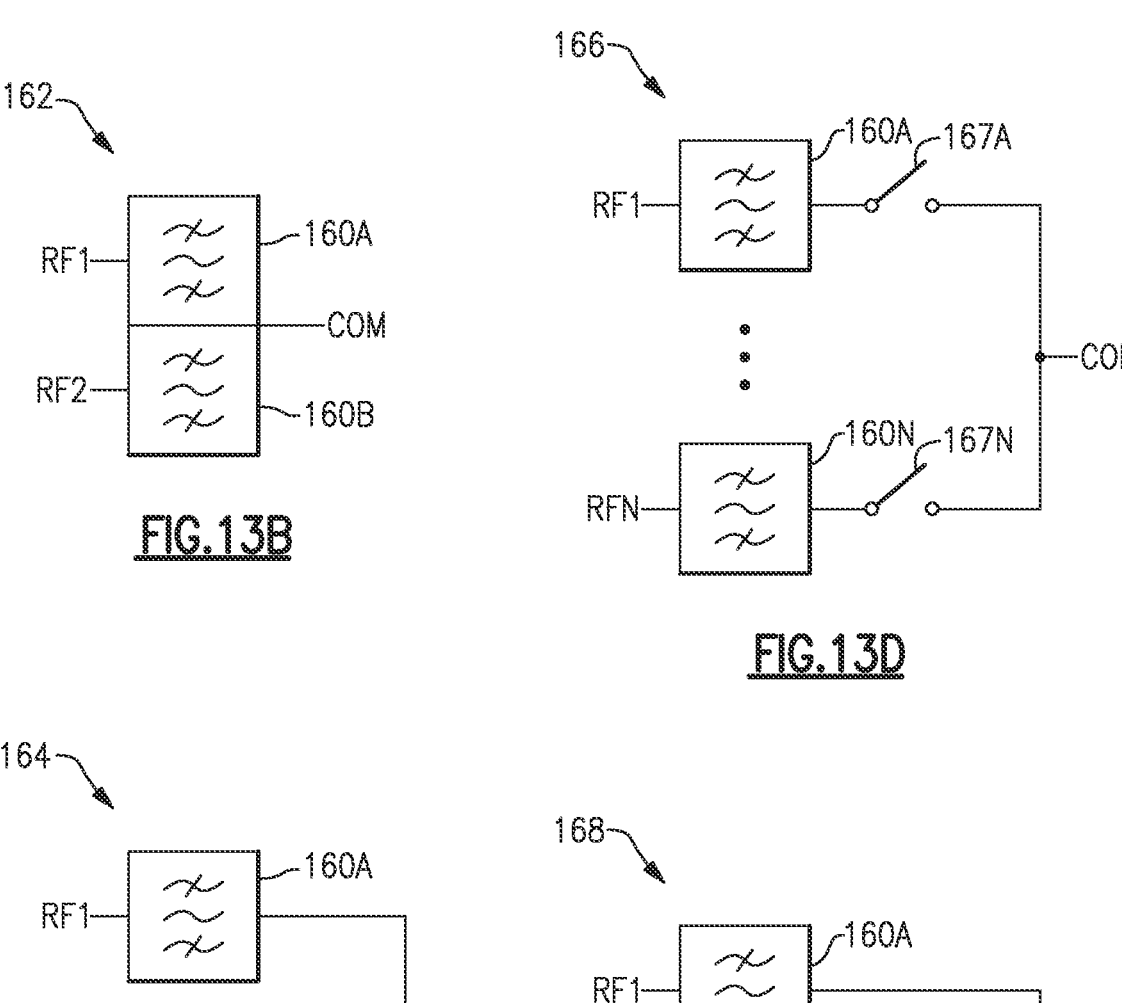
FIG. 13B is a schematic diagram of a duplexer that includes a filter according to an embodiment.
FIG. 13C is a schematic diagram of a multiplexer that includes a filter according to an embodiment.
FIG. 13D is a schematic diagram of a multiplexer that includes a filter according to an embodiment.
FIG. 13E is a schematic diagram of a multiplexer that includes a according to an embodiment.

FIG. 13D is a schematic diagram of a multiplexer 166 that includes a filter according to an embodiment. The multiplexer 166 is like the multiplexer 164 of FIG. 13C, except that the multiplexer 166 implements switched multiplexing. In switched multiplexing, a filter is coupled to a common node via a switch. In the multiplexer 166, the switches 167A to 167N can selectively electrically connect respective filters 160A to 160N to the common node COM. For example, the switch 167A can selectively electrically connect the first filter 160A the common node COM via the switch 167A. Any suitable number of the switches 167A to 167N can electrically a respective filter 160A to 160N to the common node COM in a given state. Similarly, any suitable number of the switches 167A to 167N can electrically isolate a respective filter 160A to 160N to the common node COM in a given state. The functionality of the switches 167A to 167N can support various carrier aggregations.

FIG. 13E is a schematic diagram of a multiplexer 168 that includes a filter according to an embodiment. The multiplexer 168 illustrates that a multiplexer can include any suitable combination of hard multiplexed and switched multiplexed filters. One or more acoustic wave filters in accordance with any suitable principles and advantages disclosed herein can be a filter (e.g., the filter 160A) that is hard multiplexed to the common node COM of the multiplexer 168. Alternatively or additionally, one or more acoustic wave filters in accordance with any suitable principles and advantages disclosed herein can be a filter (e.g., the filter 160N) that is switch multiplexed to the common node COM of the multiplexer 168.

Figure 14:
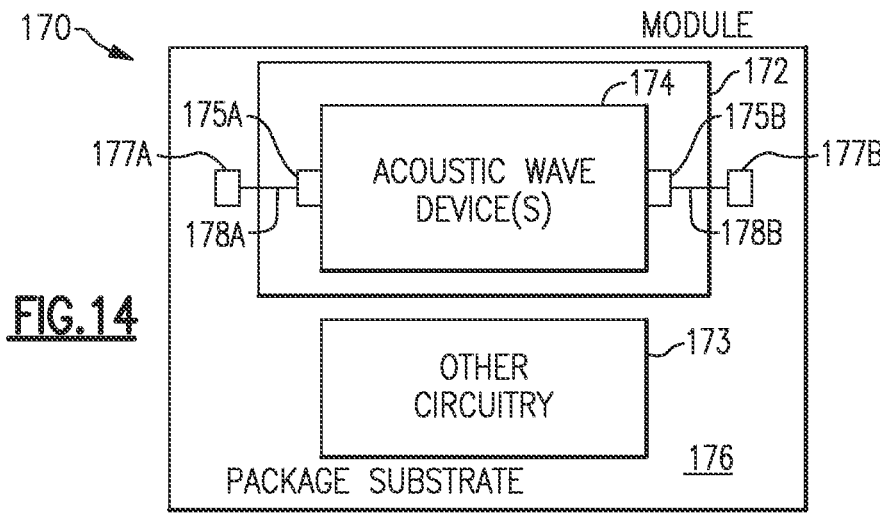
FIGS. 14, 15, and 16 are schematic block diagrams of illustrative packaged modules according to certain embodiments.
Figure 15:
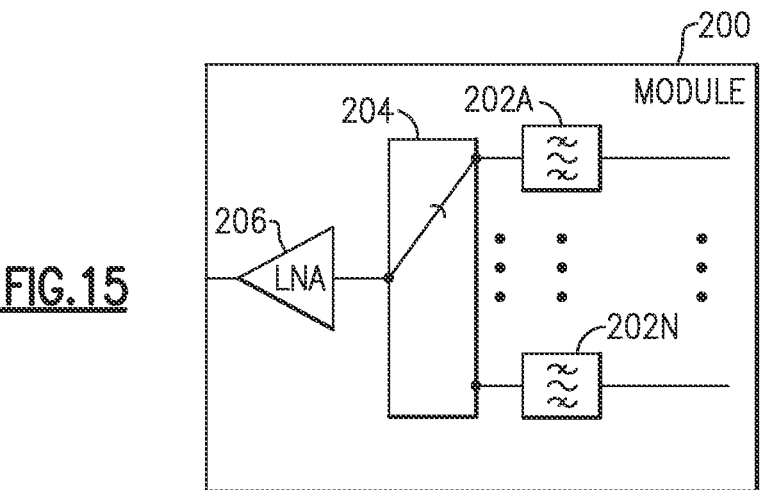
Figure 16:
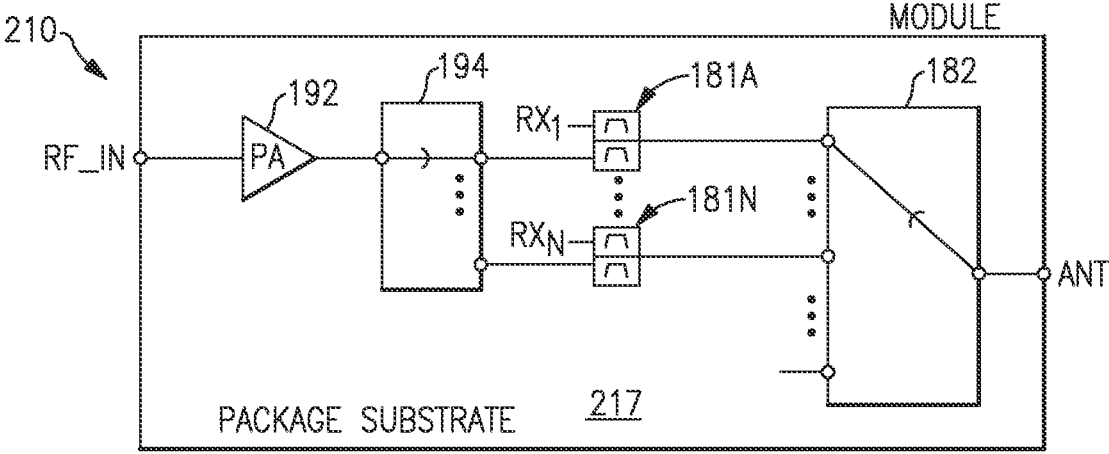

Filters and/or BAW device structures disclosed herein can be implemented in a variety of packaged modules. Some example packaged modules will now be disclosed in which any suitable principles and advantages of the filters disclosed herein can be implemented. The example packaged modules can include a package that encloses the illustrated circuit elements. A module that includes a radio frequency component can be referred to as a radio frequency module. The illustrated circuit elements can be disposed on a common packaging substrate. The packaging substrate can be a laminate substrate, for example. FIGS. 14 to 16 are schematic block diagrams of illustrative packaged modules according to certain embodiments. Any suitable combination of features of these packaged modules can be implemented with each other.

FIG. 14 is a schematic diagram of a radio frequency module 170 that includes an acoustic wave component 172 according to an embodiment. The illustrated radio frequency module 170 includes the acoustic wave component 172 and other circuitry 173. The acoustic wave component 172 can include acoustic wave devices 174 of a filter, for example. The acoustic wave devices 174 can be BAW devices in certain applications.

The acoustic wave component 172 shown in FIG. 14 includes acoustic wave devices 174 and terminals 175A and 175B. The acoustic wave devices 174 can be included in a filter in accordance with any suitable principles and advantages disclosed herein. The terminals 175A and 174B can serve, for example, as an input contact and an output contact. Although two terminals are illustrated, any suitable number of terminals can be implemented for a particular application. The acoustic wave component 172 and the other circuitry 173 are on a common packaging substrate 176 in FIG. 14. The packaging substrate 176 can be a laminate substrate. The terminals 175A and 175B can be electrically connected to contacts 177A and 177B, respectively, on the packaging substrate 176 by way of electrical connectors 178A and 178B, respectively. The electrical connectors 178A and 178B can be bumps or wire bonds, for example.

The other circuitry 173 can include any suitable additional circuitry. For example, the other circuitry can include one or more radio frequency amplifiers (e.g., one or more power amplifiers and/or one or more low noise amplifiers), one or more radio frequency switches, one or more additional filters, one or more RF couplers, one or more delay lines, one or more phase shifters, the like, or any suitable combination thereof. Accordingly, the other circuitry 173 can include one or more radio frequency circuit elements. The other circuitry 173 can be referred to as radio frequency circuitry in certain applications. The other circuitry 173 can be electrically connected to the acoustic wave devices 174. The radio frequency module 170 can include one or more packaging structures to, for example, provide protection and/or facilitate easier handling of the radio frequency module 170. Such a packaging structure can include an overmold structure formed over the packaging substrate 176. The overmold structure can encapsulate some or all of the components of the radio frequency module 170.

FIG. 15 is a schematic block diagram of a module 200 that includes filters 202A to 202N, a radio frequency switch 204, and a low noise amplifier 206 according to an embodiment. One or more filters of the filters 202A to 202N can be implemented in accordance with any suitable principles and advantages disclosed herein. Any suitable number of filters 202A to 202N can be implemented. The illustrated filters 202A to 202N are receive filters. One or more of the filters 202A to 202N can be included in a multiplexer that also includes a transmit filter and/or another receive filter. The radio frequency switch 204 can be a multi-throw radio frequency switch. The radio frequency switch 204 can electrically couple an output of a selected filter of filters 202A to 202N to the low noise amplifier 206. In some embodiments, a plurality of low noise amplifiers can be implemented. The module 200 can include diversity receive features in certain applications.

FIG. 16 is a schematic diagram of a radio frequency module 210 that includes a filter according to an embodiment. As illustrated, the radio frequency module 210 includes duplexers 181A to 181N, a power amplifier 192, a radio frequency switch 194 configured as a select switch, and an antenna switch 182. The radio frequency module 210 can include a package that encloses the illustrated elements. The illustrated elements can be disposed on a common packaging substrate 217. The packaging substrate 217 can be a laminate substrate, for example. A radio frequency module that includes a power amplifier can be referred to as a power amplifier module. A radio frequency module can include a subset of the elements illustrated in FIG. 16 and/or additional elements.

The duplexers 181A to 181N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the receive filters can be a filter in accordance with any suitable principles and advantages disclosed herein. Alternatively or additionally, one or more of the transmit filters can be a filter in accordance with any suitable principles and advantages disclosed herein. Although FIG. 16 illustrates duplexers, any suitable principles and advantages disclosed herein can be implemented in other multiplexers (e.g., quadplexers, hexaplexers, octoplexers, etc.) and/or in switched multiplexers and/or with standalone filters.

The power amplifier 192 can amplify a radio frequency signal. The illustrated radio frequency switch 194 is a multi-throw radio frequency switch. The radio frequency switch 194 can electrically couple an output of the power amplifier 192 to a selected transmit filter of the transmit filters of the duplexers 181A to 181N. In some instances, the radio frequency switch 194 can electrically connect the output of the power amplifier 192 to more than one of the transmit filters. The antenna switch 182 can selectively couple a signal from one or more of the duplexers 181A to 181N to an antenna port ANT. The duplexers 181A to 181N can be associated with different frequency bands and/or different modes of operation (e.g., different power modes, different signaling modes, etc.).

Figure 17:
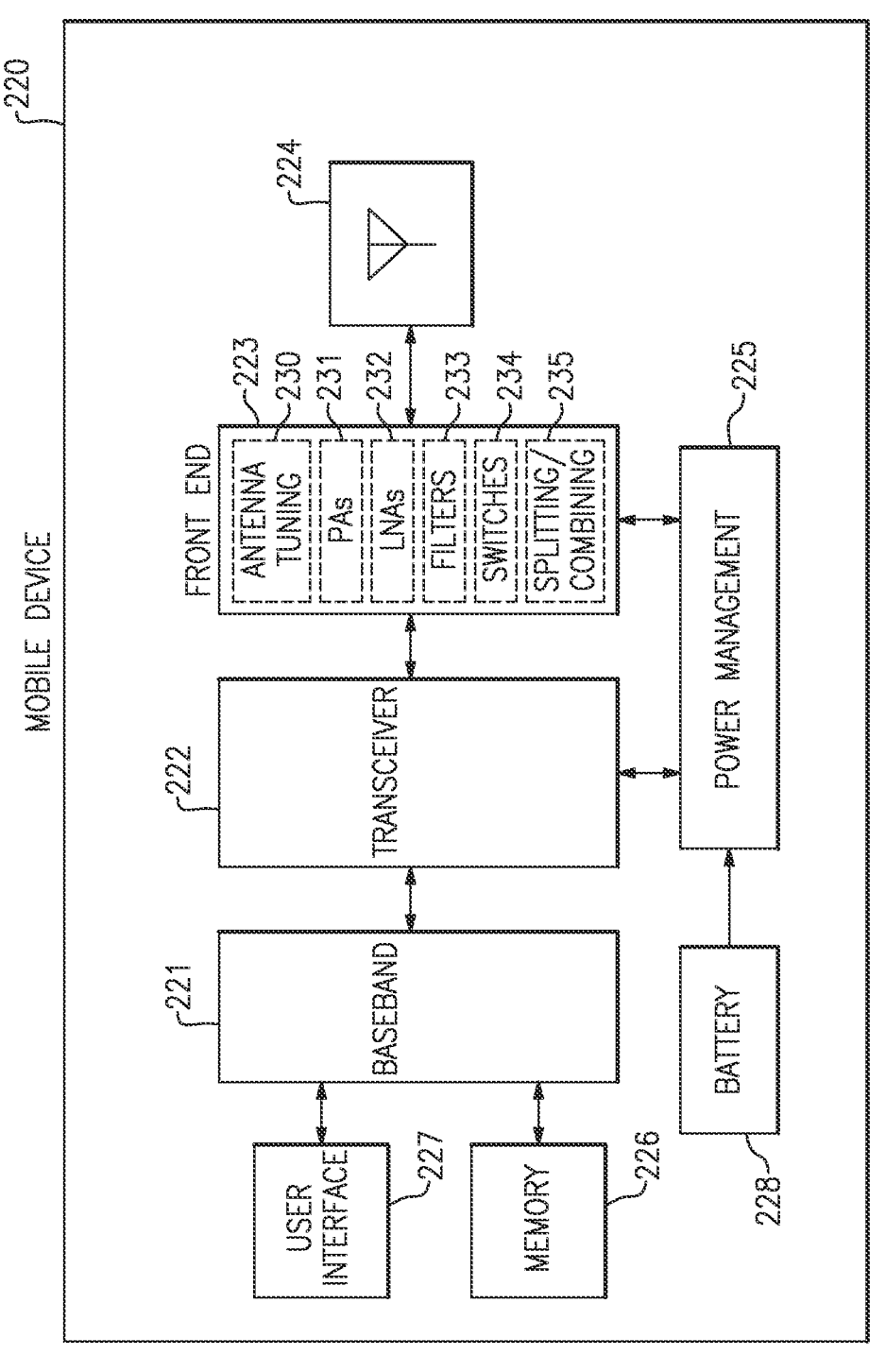
FIG. 17 is a schematic diagram of one embodiment of a mobile device.

The filters disclosed herein can be implemented in wireless communication devices. FIG. 17 is a schematic block diagram of a wireless communication device 220 that includes a filter according to an embodiment. The wireless communication device 220 can be a mobile device. The wireless communication device 220 can be any suitable wireless communication device. For instance, a wireless communication device 220 can be a mobile phone, such as a smart phone. As illustrated, the wireless communication device 220 includes a baseband system 221, a transceiver 222, a front end system 223, one or more antennas 224, a power management system 225, a memory 226, a user interface 227, and a battery 228.

The wireless communication device 220 can be used to communicate using a wide variety of communications technologies, including, but not limited to, 2G, 3G, 4G (including LTE, LTE-Advanced, and/or LTE-Advanced Pro), 5G NR, WLAN (for instance, Wi-Fi), WPAN (for instance, Bluetooth and/or ZigBee), WMAN (for instance, WiMax), and/or GPS technologies.

The transceiver 222 generates RF signals for transmission and processes incoming RF signals received from the antennas 224. Various functionalities associated with the transmission and receiving of RF signals can be achieved by one or more components that are collectively represented in FIG. 17 as the transceiver 222. In one example, separate components (for instance, separate circuits or dies) can be provided for handling certain types of RF signals.

The front end system 223 aids in conditioning signals provided to and/or received from the antennas 224. In the illustrated embodiment, the front end system 223 includes antenna tuning circuitry 230, power amplifiers (PAs) 231, low noise amplifiers (LNAs) 232, filters 233, switches 234, and signal splitting/combining circuitry 235. However, other implementations are possible. The filters 233 can include one or more filters in accordance with any suitable principles and advantages disclosed herein.

The front end system 223 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 220 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 224 can include antennas used for a wide variety of types of communications. For example, the antennas 224 can include antennas for transmitting and/or receiving signals associated with a wide variety of frequencies and communications standards.

In certain implementations, the antennas 224 support MIMO communications and/or switched diversity communications. For example, MIMO communications can use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 220 can operate with beamforming in certain implementations. For example, the front end system 223 can include amplifiers having controllable gain and phase shifters having controllable phase to provide beam formation and directivity for transmission and/or reception of signals using the antennas 224. For example, in the context of signal transmission, the amplitude and phases of the transmit signals provided to the antennas 224 are controlled such that radiated signals from the antennas 224 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 224 from a particular direction. In certain implementations, the antennas 224 include one or more arrays of antenna elements to enhance beamforming.

The baseband system 221 is coupled to the user interface 227 to facilitate processing of various user input and output (I/O), such as voice and data. The baseband system 221 can include a baseband processor. The baseband system 221 provides the transceiver 222 with digital representations of transmit signals, which the transceiver 222 processes to generate RF signals for transmission. The baseband system 221 also processes digital representations of received signals provided by the transceiver 222. As shown in FIG. 17, the baseband system 221 is coupled to the memory 226 of facilitate operation of the wireless communication device 220.

The memory 226 can be used for a wide variety of purposes, such as storing data and/or instructions to facilitate the operation of the wireless communication device 220 and/or to provide storage of user information.

The power management system 225 provides a number of power management functions of the wireless communication device 220. In certain implementations, the power management system 225 includes a PA supply control circuit that controls the supply voltages of the power amplifiers 231. For example, the power management system 225 can be configured to change the supply voltage(s) provided to one or more of the power amplifiers 231 to improve efficiency, such as power added efficiency (PAE).

As shown in FIG. 17, the power management system 225 receives a battery voltage from the battery 228. The battery 228 can be any suitable battery for use in the wireless communication device 220, including, for example, a lithium-ion battery.

Technology disclosed herein can be implemented in filters with acoustic wave resonators in 5G applications. 5G technology is also referred to herein as 5G New Radio (NR). 5G NR supports and/or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR. A filter including any suitable combination of features disclosed herein can be arranged to filter a radio frequency signal in a 5G NR operating band within Frequency Range 1 (FR1). FR1 can be from 410 MHz to 7.125 GHz, for example, as specified in a current 5G NR specification. A filter in accordance with any suitable principles and advantages disclosed herein can be arranged to filter a radio frequency signal in a fourth generation (4G) Long Term Evolution (LTE). An acoustic wave filter in accordance with any suitable principles and advantages disclosed herein can have a passband that includes a 4G LTE operating band and a 5G NR operating band. Such a filter can be implemented in a dual connectivity application, such as an E-UTRAN New Radio-Dual Connectivity (ENDC) application.

Filters disclosed herein can have relatively steep filter skirts. At the same time, the filters disclosed herein can achieve relatively low insertion loss near a band edge with a steep filter skirt. Such features can be advantageous in 5G NR applications. Filters disclosed herein can meet design specifications for one or more 5G NR operating bands that are challenging to meet with acoustic wave ladder filters with other types capacitors in a similar physical die area.

Figure 18:
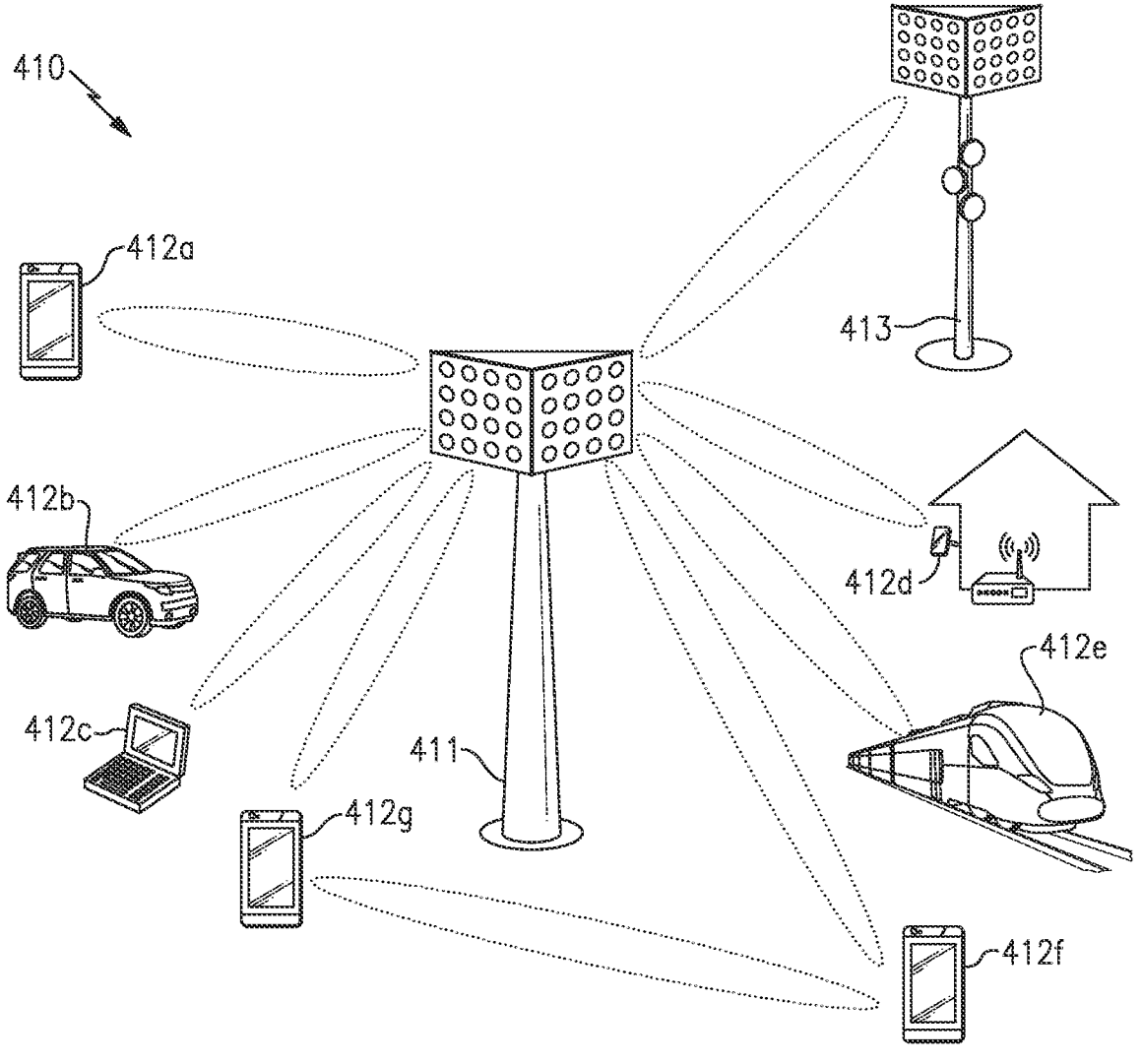
FIG. 18 is a schematic diagram of one example of a communication network.

FIG. 18 is a schematic diagram of one example of a communication network 410. The communication network 410 includes a macro cell base station 411, a small cell base station 413, and various examples of user equipment (UE), including a first mobile device 412a, a wireless-connected car 412b, a laptop 412c, a stationary wireless device 412d, a wireless-connected train 412e, a second mobile device 412f, and a third mobile device 412g. UEs are wireless communication devices. One or more of the macro cell base station 411, the small cell base station 413, or UEs illustrated in FIG. 18 can implement one or more of the filters in accordance with any suitable principles and advantages disclosed herein. For example, one or more of the UEs shown in FIG. 18 can include one or more filters in accordance with any suitable principles and advantages disclosed herein.

Although specific examples of base stations and user equipment are illustrated in FIG. 18, a communication network can include base stations and user equipment of a wide variety of types and/or numbers. For instance, in the example shown, the communication network 410 includes the macro cell base station 411 and the small cell base station 413. The small cell base station 413 can operate with relatively lower power, shorter range, and/or with fewer concurrent users relative to the macro cell base station 411. The small cell base station 413 can also be referred to as a femtocell, a picocell, or a microcell. Although the communication network 410 is illustrated as including two base stations, the communication network 410 can be implemented to include more or fewer base stations and/or base stations of other types.

Although various examples of user equipment are shown, the teachings herein are applicable to a wide variety of user equipment, including, but not limited to, mobile phones, tablets, laptops, Internet of Things (IoT) devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 410 of FIG. 18 supports communications using a variety of cellular technologies, including, for example, 4G LTE and 5G NR. In certain implementations, the communication network 410 is further adapted to provide a wireless local area network (WLAN), such as WiFi. Although various examples of communication technologies have been provided, the communication network 410 can be adapted to support a wide variety of communication technologies.

Various communication links of the communication network 410 have been depicted in FIG. 18. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communication that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and Wi-Fi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed Wi-Fi frequencies).

As shown in FIG. 18, the communication links include not only communication links between UE and base stations, but also UE to UE communications and base station to base station communications. For example, the communication network 410 can be implemented to support self-fronthaul and/or self-backhaul (for instance, as between mobile device 412g and mobile device 412f).

The communication links can operate over a wide variety of frequencies. In certain implementations, communications are supported using 5G NR technology over one or more frequency bands that are less than 6 GHz and/or over one or more frequency bands that are greater than 6 GHz. According to certain implementations, the communication links can serve Frequency Range 1 (FR1), Frequency Range 2 (FR2), or a combination thereof. An acoustic wave filter in accordance with any suitable principles and advantages disclosed herein can filter a radio frequency signal within FR1. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 410 can share available network resources, such as available frequency spectrum, in a wide variety of ways. In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 3 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 410 of FIG. 18 can be used to support a wide variety of advanced communication features, including, but not limited to, eMBB, uRLLC, and/or mMTC.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHZ, such as in a frequency range from about 450 MHz to 5 GHz, in a frequency range from about 400 MHz to 8.5 GHZ, or in FR1.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively.

While certain embodiments have been described, these embodiments have been presented by way of example only, and are not intended to limit the scope of the disclosure. Indeed, the novel acoustic filters described herein may be embodied in a variety of other forms. Furthermore, various omissions, substitutions, and changes in the form of the acoustic filters described herein may be made without departing from the spirit of the disclosure. Any suitable combination of the elements and/or acts of the various embodiments described above can be combined to provide further embodiments. The accompanying claims and their equivalents are intended to cover such forms or modifications as would fall within the scope of the disclosure.

What is claimed is:

1. A bulk acoustic wave component comprising:
   a bulk acoustic wave resonator including an acoustic reflector, a first electrode, a second electrode, and piezoelectric layer over the acoustic reflector and between the first electrode and the second electrode;
   a circuit element electrically connected to the bulk acoustic wave resonator, the circuit element including conductive material buried in a dielectric layer; and
   a capacitor including an electrode buried in the dielectric layer.

2. The bulk acoustic wave component of claim 1 wherein the dielectric layer extends under the acoustic reflector.

3. The bulk acoustic wave component of claim 1 wherein the capacitor is coupled to the bulk acoustic wave resonator.

4. The bulk acoustic wave component of claim 1 wherein the capacitor is positioned laterally relative to the acoustic reflector.

5. The bulk acoustic wave component of claim 1 wherein the capacitor is a metal-insulator-metal capacitor consisting of the electrode, a second electrode, and material of the dielectric layer positioned between the electrode and the second electrode.

6. The bulk acoustic wave component of claim 1 wherein the electrode of the capacitor is thicker than the first electrode of the bulk acoustic wave resonator.

7. The bulk acoustic wave component of claim 1 wherein the circuit element is an inductor.

8. The bulk acoustic wave component of claim 1 wherein the circuit element is a tuning stub.

9. The bulk acoustic wave component of claim 1 wherein the circuit element is a fuse element.

10. The bulk acoustic wave component of claim 1 further comprising a terminal located outside of a footprint of the bulk acoustic wave resonator, the circuit element electrically connected to the terminal.

11. The bulk acoustic wave component of claim 1 wherein the acoustic reflector is an air cavity.

12. The bulk acoustic wave component of claim 1 wherein the bulk acoustic wave resonator, the capacitor, and the circuit element are included in a band pass filter arranged to filter a radio frequency signal.

13. The bulk acoustic wave component of claim 1 wherein the capacitor is in parallel with the bulk acoustic wave resonator.

14. The bulk acoustic wave component of claim 1 wherein the capacitor is in series with the bulk acoustic wave resonator.

15. An acoustic wave filter for filtering a radio frequency signal, the acoustic wave filter comprising:
   a bulk acoustic wave resonator;
   a circuit element electrically connected to the bulk acoustic wave resonator, the circuit element including conductive material buried in a dielectric layer;
   a metal-insulator-metal capacitor including an electrode buried in the dielectric layer; and
   a plurality of additional bulk acoustic wave resonators connected to the bulk acoustic wave resonator.

16. The acoustic wave filter of claim 15 wherein the circuit element is an inductor.

17. The acoustic wave filter of claim 15 wherein the circuit element is a tuning stub.

18. The acoustic wave filter of claim 15 wherein the circuit element is a fuse element.

19. The acoustic wave filter of claim 15 wherein the metal-insulator-metal capacitor is connected in parallel with the bulk acoustic wave resonator.

20. A packaged radio frequency module comprising:
   a filter including a bulk acoustic wave resonator, a circuit element electrically connected to the bulk acoustic wave resonator and including conductive material buried in a dielectric layer, and a metal-insulator-metal capacitor including an electrode buried in the dielectric layer;
   a power amplifier operatively coupled to the filter; and
   a packaging structure enclosing the filter and the power amplifier.

* * * * *